(12) United States Patent
Uemichi

(10) Patent No.: US 12,224,727 B2
(45) Date of Patent: Feb. 11, 2025

(54) DIGITAL PHASE SHIFTER

(71) Applicant: Fujikura Ltd., Tokyo (JP)

(72) Inventor: Yusuke Uemichi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 18/273,904

(22) PCT Filed: Feb. 7, 2023

(86) PCT No.: PCT/JP2023/003963
§ 371 (c)(1),
(2) Date: Jul. 24, 2023

(87) PCT Pub. No.: WO2024/047891
PCT Pub. Date: Mar. 7, 2024

(65) Prior Publication Data
US 2024/0396530 A1    Nov. 28, 2024

(30) Foreign Application Priority Data
Aug. 30, 2022  (JP) .................. 2022-136616

(51) Int. Cl.
H03H 11/16       (2006.01)
(52) U.S. Cl.
CPC .................................. H03H 11/16 (2013.01)
(58) Field of Classification Search
CPC .......... H03H 9/66; H03H 11/16; H03H 11/18; H03H 11/20; H03H 11/22; H03H 7/18;
(Continued)

(56) References Cited

U.S. PATENT DOCUMENTS 12,040,765 B1 *  7/2024  Uemichi ................... H01P 1/18
12,052,007 B1 *  7/2024  Uemichi ................ H01P 1/184

FOREIGN PATENT DOCUMENTS

CN        109616723 A     4/2019
JP          7072118 B1     5/2022
(Continued)

OTHER PUBLICATIONS

International Search Report dated Mar. 28, 2023, issued in counterpart International Application No. PCT/JP2023/003963. (2 pages).
(Continued)

*Primary Examiner* — Hai L Nguyen
(74) *Attorney, Agent, or Firm* — WHDA, LLP

(57) ABSTRACT

A digital phase shifter includes a first row, a second row arranged to extend in parallel to the first row, and a connection unit electrically connecting one ends of the first and second rows. Each of the first and second rows is configured by connecting a plurality of digital phase shift circuits in cascade, and each digital phase shift circuit includes an outer line and the like. For the digital phase shift circuits adjacent to each other in each of the first and second rows, outer lines adjacent to each other are separated, a first ground conductor and a second ground conductor adjacent to each other are separated, and positional relationships of the outer line to a signal line are reversed. A plurality of the outer lines included in the first row are not adjacent to a plurality of the outer lines included in the second row.

2 Claims, 12 Drawing Sheets

(58) Field of Classification Search
CPC . H03H 7/19; H03H 7/20; H03H 17/08; H01P 1/18; H01Q 3/38
USPC .................................................. 327/231–237
See application file for complete search history.

(56) References Cited

FOREIGN PATENT DOCUMENTS

| | | |
|---|---|---|
| JP | 7076658 B1 | 5/2022 |
| JP | 7111880 B1 | 8/2022 |
| JP | 7111920 B1 | 8/2022 |
| JP | 7111923 B1 | 8/2022 |

OTHER PUBLICATIONS

Tousi et al., "A Ka-band Digitally-Controlled Phase Shifter with sub-degree Phase Precision", 2016 IEEE Radio Frequency Integrated Circuits Symposium, (2016), pp. 356-359. Cited in Specification. (4 pages).

\* cited by examiner

DIGITAL PHASE SHIFTER

TECHNICAL FIELD

The present invention relates to a digital phase shifter.
Priority is claimed on Japanese Patent Application No. 2022-136616, filed Aug. 30, 2022, the content of which is incorporated herein by reference.

BACKGROUND ART

In the following Non-Patent Document 1, a digitally controlled phase shift circuit (a digital phase shift circuit) targeting microwaves, quasi-millimeter waves, or millimeter waves is disclosed. As shown in FIG. 2 of Non-Patent Document 1, this digital phase shift circuit includes a signal line, two inner lines provided on both sides of the signal line, two outer lines provided outside of the two inner lines, a first ground bar connected to one end of each of the two inner lines and the two outer lines, a second ground bar connected to the other end of each of the two outer lines, two N-channel metal-oxide semiconductor (NMOS) switches, each of the switches being provided between the other end of each of the two inner lines and the second ground bar, and the like.

This digital phase shift circuit switches the operation mode between a low-delay mode and a high-delay mode by switching a return current flowing through the two inner lines or the two outer lines due to the transmission of signal waves in the signal line in accordance with the opening/closing of the two NMOS switches. That is, in the digital phase shift circuit, the operation mode becomes the low-delay mode when the return current flows through the two inner lines and the operation mode becomes the high-delay mode when the return current flows through the two outer lines.

PRIOR ART DOCUMENT

Non-Patent Document

[Non-Patent Document 1] A Ka-band Digitally-Controlled Phase Shifter with Sub-degree Phase Precision (2016, IEEE, RFIC)

DISCLOSURE OF INVENTION

Problems to be Solved by the Invention

Meanwhile, the above-described digital phase shift circuit is applied to a base station of a $5^{th}$ generation (5G) communication network using, for example, a phased array antenna or the like, and a large number of digital phase shift circuits are actually mounted on a semiconductor substrate in a state in which the digital phase shift circuits are connected in cascade. That is, the above-described digital phase shift circuit is a unitary unit in the configuration of the actual phase shifter and constitutes a digital phase shifter that exhibits a desired function by connecting several tens of digital phase shift circuits in cascade.

However, it is desirable to make a value of inductance (an inductance value), which is one of the circuit constants, during the high-delay mode be sufficiently larger than an inductance value during the low-delay mode in this digital phase shifter, but there is a problem that a size thereof may increase when the inductance value is increased. As a result, it is difficult for a conventional digital phase shifter to sufficiently secure a difference (a phase shift amount) between the phase during the low-delay mode and the phase during the high-delay mode particularly at a low frequency.

The present invention has been made in view of the above-described circumstances and an objective of the present invention is to provide a digital phase shifter capable of increasing an inductance value during a high-delay mode as compared with conventional technologies.

Means for Solving the Problems

A digital phase shifter of a first aspect of the present invention includes, for achieving the above-described objective, a first row; a second row arranged to extend in parallel to the first row and to overlap the first row viewed in an orthogonal direction to a direction in which the first row extends; and a connection unit electrically connecting one end of the first row and one end of the second row, wherein each of the first row and the second row is configured by connecting a plurality of digital phase shift circuits in cascade, each of the digital phase shift circuits including at least a signal line, two inner lines provided on both sides of the signal line, an outer line provided outside of one of the two inner lines or provided outside of the other of the two inner lines, a first ground conductor connected to one end of each of the inner lines and the outer line, a second ground conductor connected to the other end of the outer line, and two electronic switches, each of the electronic switches being provided between the other end of each of the inner lines and the second ground conductor, wherein the first ground conductor and the second ground conductor adjacent to each other are separated for the digital phase shift circuits adjacent to each other in the first row, wherein positional relationships of the outer line to the signal line are reversed for the digital phase shift circuits adjacent to each other in the first row, wherein the first ground conductor and the second ground conductor adjacent to each other are separated for the digital phase shift circuits adjacent to each other in the second row, wherein positional relationships of the outer line to the signal line are reversed for the digital phase shift circuits adjacent to each other in the second row, and wherein a plurality of the outer lines included in the first row are not adjacent to a plurality of the outer lines included in the second row in the orthogonal direction.

A second aspect of the present invention is that in the above-described first aspect, the inner lines and the outer line are formed in the same conductive layer.

A digital phase shifter of a third aspect of the present invention includes, for achieving the above-described objective, a plurality of digital phase shift circuits and a plurality of modified digital phase shift circuits, the plurality of digital phase shift circuits and the plurality of modified digital phase shift circuits being alternately connected in cascade, wherein each of the digital phase shift circuits includes at least a signal line, two inner lines provided on both sides of the signal line, two outer lines provided outside of the two inner lines, a first ground conductor connected to one end of each of the inner lines and the outer lines, a second ground conductor connected to the other end of each of the outer lines, and two electronic switches, each of the electronic switches being provided between the other end of each of the inner lines and the second ground conductor, and wherein each of the modified digital phase shift circuits includes at least a signal line, two inner lines provided on both sides of the signal line, two loop ground conductors having one ends connected to one ends of the inner lines and having U-shapes protruding toward outsides of the inner lines, and two electronic switches, one of the electronic switches being provided between the other end of one of the inner lines and the other end of one of the loop ground conductors, the other of the electronic switches being provided between the other end of the other of the inner lines and the other end of the other of the loop ground conductors.

A fourth aspect of the present invention is that in the above-described third aspect, one of the two outer lines is deleted in each of the plurality of digital phase shift circuits, and one of the two loop ground conductors is deleted in each of the plurality of modified digital phase shift circuits.

Effects of the Invention

According to the present invention, it is possible to provide a digital phase shifter capable of increasing an inductance value during a high-delay mode as compared with conventional technologies.

EMBODIMENTS FOR CARRYING OUT THE INVENTION

Hereinafter, embodiments of the present invention will be described with reference to the drawings.

First Embodiment

First, a first embodiment of the present invention will be described. A digital phase shifter A1 according to the first embodiment is a high-frequency circuit that inputs high-frequency signals such as microwaves, quasi-millimeter waves, millimeter waves or the like and externally outputs a plurality of high-frequency signals that are phase-shifted by a predetermined phase shift amount.

Figure 1:
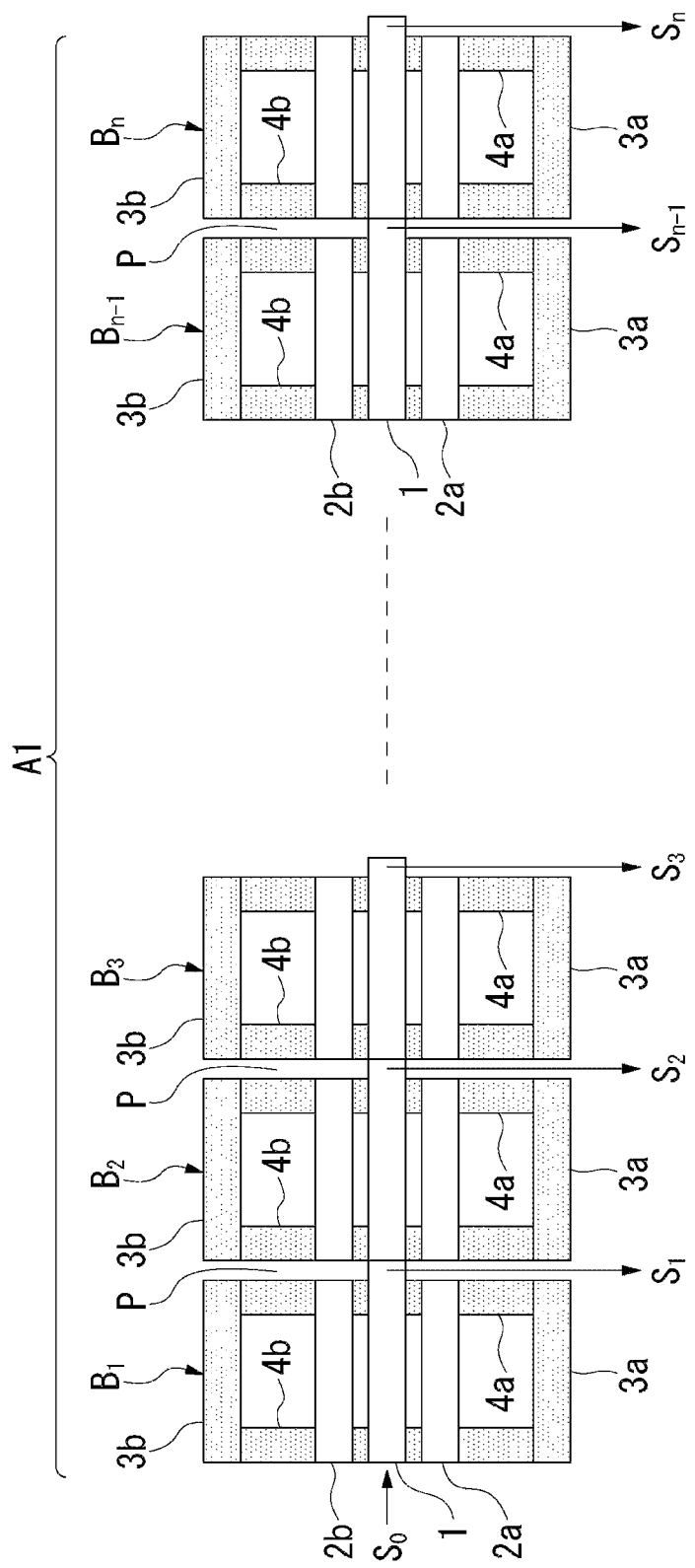
FIG. 1 is a front view showing a configuration of a digital phase shifter according to a first embodiment of the present invention.

As shown in FIG. 1, the digital phase shifter A1 is configured by connecting n (a plurality of) digital phase shift circuits $B_1$ to $B_n$ in cascade. That is, the digital phase shifter A1 is configured in which a first digital phase shift circuit $B_1$, a second digital phase shift circuit $B_2$, . . . , and an $n^{th}$ digital phase shift circuit $B_n$ are linearly connected in cascade. The digital phase shifter A1 externally outputs high-frequency signals from the first digital phase shift circuit $B_1$ or the $n^{th}$ digital phase shift circuit $B_n$.

Here, the first to $n^{th}$ digital phase shift circuits $B_1$ to $B_n$ are unitary units constituting the digital phase shifter A1 and are linearly connected in cascade to have a relationship in which ones thereof are adjacent to each other. The first to $n^{th}$ digital phase shift circuits $B_1$ to $B_n$ have substantially similar functions to the digitally controlled phase shift circuit disclosed in Non-Patent Document 1.

Figure 2:
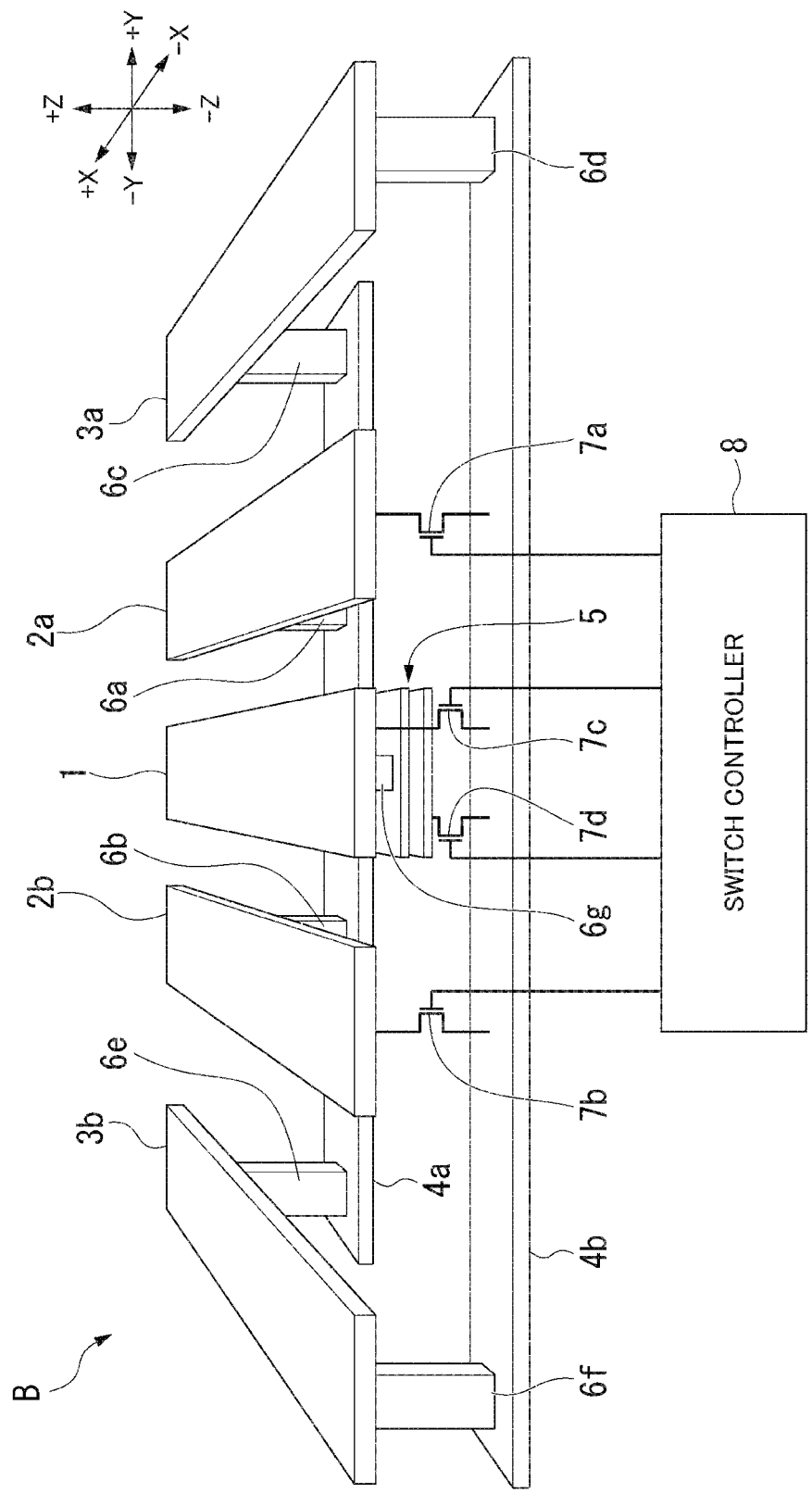
FIG. 2 is a conceptual diagram showing a functional configuration of a basic digital phase shift circuit in the embodiment of the present invention.

That is, as denoted by representative reference sign B in FIG. 2, the first to $n^{th}$ digital phase shift circuits $B_1$ to $B_n$ each include a signal line 1, two inner lines 2a and 2b, two outer lines 3a and 3b, two ground conductors 4a and 4b, a capacitor 5, seven connection conductors 6a to 6g, four electronic switches 7a to 7d, and a switch controller 8. Hereinafter, the first to $n^{th}$ digital phase shift circuits $B_1$ to $B_n$ are collectively referred to as a basic digital phase shift circuit B.

A side where the signal line 1 is provided in an opposite direction between the signal line 1 and the two ground conductors 4a and 4b may be referred to as an upper side of the basic digital phase shift circuit B and a side where the two ground conductors 4a and 4b are provided in the opposite direction may be referred to as a lower side of the basic digital phase shift circuit B.

The signal line 1 is a linear strip-shaped conductor extending in a predetermined direction as shown in FIG. 2. That is, the signal line 1 is a long plate-shaped conductor having a certain width, a certain thickness, and a predetermined length. In the signal line 1, a signal current flows from the front side (a side where the second ground conductor 4b is provided in the extension direction of the signal line 1) to the back side (a side where the first ground conductor 4a is provided in the extension direction of the signal line 1), i.e., from an end portion of the front side (an input end) to an end portion of the back side (an output end). This signal current is a high-frequency signal having a wavelength range of the above-described microwaves, quasi-millimeter waves, or millimeter waves.

This signal line 1 electrically has inductance L1 as a distributed circuit constant. The inductance L1 is parasitic inductance having a magnitude corresponding to the shape of the signal line 1, such as the length or the like of the signal line 1. Also, the signal line 1 electrically has capacitance C1 as a distributed circuit constant. The capacitance C1 is parasitic capacitance between the signal line and the inner line, between the signal line and the outer line, or between silicon substrates.

The two inner lines 2a and 2b are linear strip-shaped conductors provided on both sides of the signal line 1. Between the two inner lines 2a and 2b, the first inner line 2a is spaced apart on one side (the right side in FIG. 2) of the signal line 1 and is a long plate-shaped conductor having a certain width, a certain thickness, and a predetermined length. That is, the first inner line 2a is provided parallel to the signal line 1 at an interval of a predetermined distance therefrom and extends in a direction that is the same as the extension direction of the signal line 1.

The second inner line 2b is spaced apart on the other side (the left side in FIG. 2) of the signal line 1 and is a long plate-shaped conductor having a certain width, a certain thickness, and a predetermined length similar to the first inner line 2a. The second inner line 2b is provided parallel to the signal line 1 at an interval of a distance similar to the distance between the signal line 1 and the first inner line 2a and extends in a direction that is the same as the extension direction of the signal line 1 similarly to the first inner line 2a.

The first outer line 3a is a linear strip-shaped conductor provided outside of the first inner line 2a on the one side of the signal line 1. That is, the first outer line 3a is a long plate-shaped conductor having a certain width, a certain thickness, and a predetermined length and is provided at a position farther from the signal line 1 than the first inner line 2a on the one side of the signal line 1.

Also, the first outer line 3a is provided parallel to the signal line 1 at an interval of a predetermined distance from the signal line 1 in a state in which the first inner line 2a is interposed therebetween as shown in the drawing. That is, the first outer line 3a extends in a direction that is the same as the extension direction of the signal line 1 similarly to the first inner line 2a and the second inner line 2b.

The second outer line 3b is a linear strip-shaped conductor provided outside of the second inner line 2b on the other side of the signal line 1, i.e., a side different from a side on which the first outer line 3a is. That is, the second outer line 3b is a long plate-shaped conductor having a certain width, a certain thickness, and a predetermined length and is provided at a position farther from the signal line 1 than the second inner line 2b on the other side of the signal line 1.

Also, the second outer line 3b is provided parallel to the signal line 1 at an interval of a predetermined distance from the signal line 1 in a state in which the second inner line 2b is interposed therebetween as shown in the drawing. That is, the second outer line 3b extends in a direction that is the same as the extension direction of the signal line 1 similarly to the first inner line 2a, the second inner line 2b, and the first outer line 3a described above.

The first ground conductor 4a is a linear strip-shaped conductor provided on one end side of each of the first inner line 2a, the second inner line 2b, the first outer line 3a, and the second outer line 3b. That is, the first ground conductor 4a is a long plate-shaped conductor having a certain width, a certain thickness, and a predetermined length and is electrically grounded.

Also, the first ground conductor 4a is provided orthogonal to the first inner line 2a, the second inner line 2b, the first outer line 3a, and the second outer line 3b extending in the same direction. That is, the first ground conductor 4a is provided to extend in the left and right directions on the one end side of each of the first inner line 2a, the second inner line 2b, the first outer line 3a, and the second outer line 3b.

Furthermore, the first ground conductor 4a is provided below the first inner line 2a, the second inner line 2b, the first outer line 3a, and the second outer line 3b at an interval of a predetermined distance therefrom. That is, a certain distance is provided in the upward/downward direction between the first ground conductor 4a and an end portion of each of the first inner line 2a, the second inner line 2b, the first outer line 3a, and the second outer line 3b.

Here, the length of the first ground conductor 4a is set such that one end thereof (the right end in FIG. 2) in the left and right directions has substantially the same position as the right edge portion of the first outer line 3a. Also, the length of the first ground conductor 4a is set such that the other end thereof (the left end in FIG. 2) in the left and right directions has substantially the same position as the left edge portion of the second outer line 3b.

The second ground conductor 4b is a linear strip-shaped conductor provided on the other end side of each of the first inner line 2a, the second inner line 2b, the first outer line 3a, and the second outer line 3b. That is, the second ground conductor 4b is a long plate-shaped conductor having a certain width, a certain thickness, and a predetermined length and is electrically grounded.

Also, the second ground conductor 4b is provided orthogonal to the first inner line 2a, the second inner line 2b, the first outer line 3a, and the second outer line 3b extending in the same direction. That is, the second ground conductor 4b is provided to extend in the left and right directions on the other end side of each of the first inner line 2a, the second inner line 2b, the first outer line 3a, and the second outer line 3b.

Further, the second ground conductor 4b is provided below the first inner line 2a, the second inner line 2b, the first outer line 3a, and the second outer line 3b at an interval of a predetermined distance therefrom. That is, a certain distance is provided in the upward/downward direction between the second ground conductor 4b and an end portion of each of the first inner line 2a, the second inner line 2b, the first outer line 3a, and the second outer line 3b.

Here, the length of the second ground conductor 4b is set such that one end thereof (the right end in FIG. 2) in the left and right directions has substantially the same position as the right edge portion of the first outer line 3a. Also, the length of the second ground conductor 4b is set such that the other end thereof (the left end in FIG. 2) in the left and right directions has substantially the same position as the left edge portion of the second outer line 3b. That is, the position of the second ground conductor 4b is the same as that of the first ground conductor 4a in the left and right directions.

The capacitor 5 has parallel flat plates having an upper electrode connected to the signal line 1 via the seventh connection conductor 6g and a lower electrode connected to the second ground conductor 4b via the fourth electronic switch 7d. The capacitor 5 has capacitance Ca corresponding to a facing area of the parallel flat plates. That is, the capacitance Ca is a circuit constant provided between the signal line 1 and the second ground conductor 4b.

The first connection conductor 6a is a conductor that electrically and mechanically connects one end of the first inner line 2a and the first ground conductor 4a. That is, the first connection conductor 6a is a conductor extending in the upward/downward direction and has one end (an upper end) connected to the lower surface of the first inner line 2a and the other end (a lower end) connected to the upper surface of the first ground conductor 4a.

The second connection conductor 6b is a conductor that electrically and mechanically connects one end of the second inner line 2b and the first ground conductor 4a. That is, the second connection conductor 6b is a conductor extending in the upward/downward direction similarly to the first connection conductor 6a and has one end (an upper end) connected to the lower surface of the second inner line 2b and the other end (a lower end) connected to the upper surface of the first ground conductor 4a.

The third connection conductor 6c is a conductor that electrically and mechanically connects one end of the first outer line 3a and the first ground conductor 4a. That is, the third connection conductor 6c is a conductor extending in the upward/downward direction and has one end (an upper end) connected to the lower surface of one end of the first outer line 3a and the other end (a lower end) connected to the upper surface of the first ground conductor 4a.

The fourth connection conductor 6d is a conductor that electrically and mechanically connects the other end of the first outer line 3a and the second ground conductor 4b. That is, the fourth connection conductor 6d is a conductor extending in the upward/downward direction and has one end (an upper end) connected to the lower surface of the other end of the first outer line 3a and the other end (a lower end) connected to the upper surface of the second ground conductor 4b.

The fifth connection conductor 6e is a conductor that electrically and mechanically connects one end of the second outer line 3b and the first ground conductor 4a. That is, the fifth connection conductor 6e is a conductor extending in the upward/downward direction and has one end (an upper end) connected to the lower surface of one end of the second outer line 3b and the other end (a lower end) connected to the upper surface of the first ground conductor 4a.

The sixth connection conductor 6f is a conductor that electrically and mechanically connects the other end of the second outer line 3b and the second ground conductor 4b. That is, the sixth connection conductor 6f is a conductor extending in the upward/downward direction and has one end (an upper end) connected to the lower surface of the other end of the second outer line 3b and the other end (a lower end) connected to the upper surface of the second ground conductor 4b.

The seventh connection conductor 6g is a conductor that electrically and mechanically connects the signal line 1 and one end of the capacitor 5. That is, the seventh connection conductor 6g is a conductor extending in the upward/downward direction and has one end (an upper end) connected to the lower surface of the signal line 1 and the other end (a lower end) connected to the one end (the upper surface) of the capacitor 5.

The first electronic switch 7a is a transistor that connects the other end of the first inner line 2a to the second ground conductor 4b so as to be able to open and close therebetween. The first electronic switch 7a is, for example, a MOS-type FET as shown in the drawing and has a drain terminal connected to the other end of the first inner line 2a, a source terminal connected to the second ground conductor 4b, and a gate terminal connected to the switch controller 8.

The first electronic switch 7a switches the conductive state between the drain terminal and the source terminal to an open state or a closed state on the basis of a gate signal input from the switch controller 8 to the gate terminal. That is, the first electronic switch 7a turns ON/OFF a connection between the other end of the first inner line 2a and the second ground conductor 4b through the switch controller 8.

The second electronic switch 7b is a transistor that connects the other end of the second inner line 2b and the second ground conductor 4b so as to be able to open and close therebetween. The second electronic switch 7b is a MOS-type FET similar to the first electronic switch 7a and has a drain terminal connected to the other end of the second inner line 2b, a source terminal connected to the second ground conductor 4b, and a gate terminal connected to the switch controller 8.

The second electronic switch 7b switches the conductive state between the drain terminal and the source terminal to an open state or a closed state on the basis of a gate signal input from the switch controller 8 to the gate terminal. That is, the second electronic switch 7b turns ON/OFF a connection between the other end of the second inner line 2b and the second ground conductor 4b through the switch controller 8.

The third electronic switch 7c is a transistor that connects one end of the signal line 1 and the first ground conductor 4a so as to be able to open and close therebetween. The third electronic switch 7c is a MOS-type FET similar to the first electronic switch 7a and the second electronic switch 7b described above and has a drain terminal connected to the signal line 1, a source terminal connected to the first ground conductor 4a, and a gate terminal connected to the switch controller 8. Also, the third electronic switch 7c may be provided between the other end of the signal line 1 and the second ground conductor 4b (see FIG. 2) instead of a position between one end of the signal line 1 and the first ground conductor 4a.

This third electronic switch 7c switches the conductive state between the drain terminal and the source terminal to an open state or a closed state on the basis of a gate signal input from the switch controller 8 to the gate terminal. That is, the third electronic switch 7c turns ON/OFF a connection between one end of the signal line 1 and the first ground conductor 4a through the switch controller 8.

The fourth electronic switch 7d is a transistor that connects the other end of the capacitor 5 and the second ground conductor 4b so as to be able to open and close therebetween. The fourth electronic switch 7d is a MOS-type FET similar to the first electronic switch 7a, the second electronic switch 7b, and the third electronic switch 7c described above and has a drain terminal connected to the other end of the capacitor 5, a source terminal connected to the second ground conductor 4b, and a gate terminal connected to the switch controller 8.

This fourth electronic switch 7d switches the conductive state between the drain terminal and the source terminal to an open state or a closed state on the basis of a gate signal input from the switch controller 8 to the gate terminal. That is, the fourth electronic switch 7d turns ON/OFF a connection between the other end of the capacitor 5 and the second ground conductor 4b through the switch controller 8. Also, the fourth electronic switch 7d corresponds to the electronic switch for the capacitor in the present invention.

The switch controller 8 is a control circuit that controls the first electronic switch 7a, the second electronic switch 7b, the third electronic switch 7c, and the fourth electronic switch 7d described above. The switch controller 8 includes four output ports and individually outputs gate signals from the output ports to the gate terminals of the first electronic switch 7a, the second electronic switch 7b, the third electronic switch 7c, and the fourth electronic switch 7d. That is, the switch controller 8 controls the ON/OFF operations of the first electronic switch 7a, the second electronic switch 7b, the third electronic switch 7c, and the fourth electronic switch 7d through the above-described gate signals.

Here, a schematic diagram in which the basic digital phase shift circuit B (i.e., the first to $n^{th}$ digital phase shift circuits $B_1$ to $B_n$) is obliquely viewed such that the mechanical structure of the basic digital phase shift circuit B is easily understood is shown in FIG. 2, but the actual basic digital phase shift circuit B is formed as a laminated structure in which a plurality of conductive layers between which an insulating layer is sandwiched are laminated using semiconductor manufacturing technology.

For example, in the basic digital phase shift circuit B, the signal line 1, the first inner line 2a, the second inner line 2b, the first outer line 3a, and the second outer line 3b are formed in a first conductive layer, and the first ground conductor 4a and the second ground conductor 4b are formed in a second conductive layer facing the first conductive layer in a state in which the insulating layer is sandwiched between the first conductive layer and the second conductive layer.

The component of the first conductive layer, the component of the second conductive layer, the capacitor 5, and the first to fourth electronic switches 7a to 7d are connected through vias (through holes). That is, these vias are buried inside of the insulating layer and function as the first connection conductor 6a, the second connection conductor 6b, the third connection conductor 6c, the fourth connection conductor 6d, the fifth connection conductor 6e, the sixth connection conductor 6f, and the seventh connection conductor 6g described above.

As shown in FIG. 1, the digital phase shifter A1 configured of the basic digital phase shift circuits B (the first to $n^{th}$ digital phase shift circuits $B_1$ to $B_n$) has a configuration in which a plurality of digital phase shift circuits $B_1$ to $B_n$ are arranged such that the first ground conductor 4a and the second ground conductor 4b face each other at an interval of a predetermined distance. That is, in the digital phase shifter A1 according to the first embodiment, a gap P is formed between the first ground conductor 4a and the second ground conductor 4b in a facing relationship in ones adjacent to each other of the digital phase shift circuits $B_1$ to $B_n$. In the digital phase shift circuits $B_1$ to $B_n$, signal lines 1 and 1 adjacent to each other are connected to each other.

Next, the operation of the digital phase shifter A1 according to the first embodiment will be described in detail.

In the basic digital phase shift circuit B, the operation mode is switched in accordance with the conductive states of the first, second, and fourth electronic switches 7a, 7b, and 7d. That is, the operation modes of the basic digital phase shift circuit B include a low-delay mode in which only the first electronic switch 7a and the second electronic switch 7b are set in the ON state by the switch controller 8 and a high-delay mode in which only the fourth electronic switch 7d is set in the ON state by the switch controller 8.

In the low-delay mode, the switch controller 8 sets the first electronic switch 7a and the second electronic switch 7b in the ON state and sets the fourth electronic switch 7d in the OFF state. That is, in the low-delay mode, a first phase difference $\theta_L$ less than a second phase difference $\theta_{11}$ in the high-delay mode is caused by a first propagation delay time TL until the high-frequency signal propagates from the input end (the other end) of the signal line 1 to the output end (the one end) thereof.

This low-delay mode will be described in more detail. The first inner line 2a is in a state in which the other end thereof is connected to the second ground conductor 4b by setting the first electronic switch 7a in the ON state. That is, the first inner line 2a forms a first current-carrying path along which an electric current can flow between the one end and the other end of the first inner line 2a by connecting the one end of the first inner line 2a to the first ground conductor 4a via the first connection conductor 6a all the time and connecting the other end of the first inner line 2a to the second ground conductor 4b via the first electronic switch 7a.

On the other hand, the second inner line 2b is in a state in which the other end thereof is connected to the second ground conductor 4b by setting the second electronic switch 7b in the ON state. That is, the second inner line 2b forms a second current-carrying path along which an electric current can flow between the one end and the other end of the second inner line 2b by connecting one end of the second inner line 2b to the first ground conductor 4a via the second connection conductor 6b all the time and connecting the other end of the second inner line 2b to the second ground conductor 4b via the second electronic switch 7b.

Also, when a signal current flows from the input end to the output end of the signal line 1 in a state in which both ends of the first inner line 2a and the second inner line 2b are connected, a return current of the signal current flows from one end to the other end through the first inner line 2a and the second inner line 2b due to the propagation.

That is, a first return current flows through the first inner line 2a forming the first current-carrying path in a direction opposite to the current-carrying direction of the signal current by current-carrying of the signal current in the signal line 1. Also, a second return current flows through the second inner line 2b forming the second current-carrying path in a direction opposite to the current-carrying direction of the signal current, i.e., the direction that is the same as the direction of the first return current by current-carrying of the signal current in the signal line 1.

Here, both of the first return current flowing through the first inner line 2a and the second return current flowing through the second inner line 2b are in a direction opposite to the current-carrying direction of the signal current. Therefore, the first return current and the second return current act to reduce the inductance L1 of the signal line 1 due to electromagnetic coupling between the signal line 1 and the first inner line 2a and between the signal line 1 and the second inner line 2b. When a reduced amount of the inductance L1 is ΔLs, the effective inductance Lm of the signal line 1 is (L1-ΔLs).

Also, the signal line 1 has capacitance C1 as parasitic capacitance as described above. In the low-delay mode, since the fourth electronic switch 7d is set in the OFF state, a state is obtained in which the capacitor 5 is not connected between the signal line 1 and the second ground conductor 4b. That is, the capacitance Ca of the capacitor 5 does not affect the high-frequency signal propagating through the signal line 1. Therefore, the first propagation delay time TL proportional to $(Lm \times C1)^{1/2}$ acts on the high-frequency signal propagating through the signal line 1.

Also, the high-frequency signal at the output end (one end) of the signal line 1 is a signal in which the phase of a high-frequency signal at the input end (the other end) of the signal line 1 is delayed by the first phase difference $\theta_L$ due to the first propagation delay time TL. That is, in the low-delay mode, the inductance L1 of the signal line 1 is reduced to the inductance Lm by the first return current and the second return current and therefore the original propagation delay time of the signal line 1 is reduced. As a result, the first phase difference $\theta_L$ smaller than the original phase difference that the signal line 1 has is implemented.

Here, in the low-delay mode, the loss of the signal line 1 is intentionally increased by setting the third electronic switch 7c in the ON state. The purpose of the loss imposition is to bring the output amplitude of the high-frequency signal in the low-delay mode close to the output amplitude in the high-delay mode That is, the loss of the high-frequency signal in the low-delay mode is clearly less than the loss of the high-frequency signal in the high-delay mode. This loss difference causes an amplitude difference of the high-frequency signal output from the basic digital phase shift circuit B when the operation mode is switched between the low-delay mode and the high-delay mode. In this situation, in the basic digital phase shift circuit B, the above-described amplitude difference is eliminated by setting the third electronic switch 7c in the ON state in the low-delay mode.

On the other hand, in the high-delay mode, the switch controller 8 sets the first electronic switch 7a, the second electronic switch 7b, and the third electronic switch 7c in the OFF state and sets the fourth electronic switch 7d in the ON state. That is, in the high-delay mode, a second phase difference OH larger than the first phase difference $\theta_L$ in the low-delay mode is caused by a second propagation delay time TH until the high-frequency signal propagates from the input end (the other end) of the signal line 1 to the output end (the one end) thereof.

In this high-delay mode, since the first electronic switch 7a and the second electronic switch 7b are set in the OFF state, the first current-carrying path is not formed on the first inner line 2a and the second current-carrying path is not formed on the second inner line 2b. Therefore, the first return current flowing through the first inner line 2a becomes significantly small and the second return current flowing through the second inner line 2b becomes significantly small.

On the other hand, the first outer line 3a has one end connected to the first ground conductor 4a via the third connection conductor 6c and the other end connected to the second ground conductor 4b via the fourth connection conductor 6d. That is, a third current-carrying path along which an electric current can flow between the one end and the other end of the first outer line 3a is formed in advance on the first outer line 3a. Therefore, in the high-delay mode, a third return current flows from one end of the first outer line 3a to the other end thereof due to the signal current in the signal line 1. This third return current is in a direction opposite to the current-carrying direction of the signal current in the signal line 1. Therefore, the third return current can reduce the inductance L1 of the signal line 1 due to electromagnetic coupling between the signal line 1 and the first outer line 3a.

Also, the second outer line 3b has one end connected to the first ground conductor 4a via the fifth connection conductor 6e and the other end connected to the second ground conductor 4b via the sixth connection conductor 6f. That is, a fourth current-carrying path along which an electric current can flow between the one end and the other end of the second outer line 3b is formed in advance on the second outer line 3b. Therefore, in the high-delay mode, a fourth return current flows from the one end of the second outer line 3b to the other end thereof due to the signal current in the signal line 1. This fourth return current is in a direction opposite to the current-carrying direction of the signal current in the signal line 1. Therefore, the fourth return current can reduce the inductance L1 of the signal line 1 due to electromagnetic coupling between the signal line 1 and the second outer line 3b.

Here, distances between the signal line 1 and the first outer line 3a and between the signal line 1 and the second outer line 3b are greater than distances between the signal line 1 and the first inner line 2a and between the signal line 1 and the second inner line 2b. Therefore, the third return current and the fourth return current have a smaller effect of reducing the inductance L1 than the first return current and the second return current. When the reduced amount of the inductance L1 due to the third return current and the fourth return current is ΔLh, the effective inductance Lp of the signal line 1 is (L1-ΔLh).

On the other hand, the signal line 1 has capacitance C1 as parasitic capacitance. Also, in the high-delay mode, since the fourth electronic switch 7d is set in the ON state, the capacitor 5 is connected between the signal line 1 and the second ground conductor 4b. That is, the signal line 1 has capacitance Cb obtained by summing the capacitance Ca of the capacitor 5 and the capacitance C1 (parasitic capacitance). Therefore, the second propagation delay time TH proportional to $(Lp \times Cb)^{1/2}$ acts on the high-frequency signal propagating through the signal line 1.

Also, the high-frequency signal at the output end of the signal line 1 is a signal in which the phase of the high-frequency signal at the input end of the signal line 1 is delayed by the second phase difference OH due to this second propagation delay time TH. That is, in the high-delay mode, the second phase difference $\theta_H$ greater than the first phase difference $\theta_L$ of the low-delay mode is implemented by weakly reducing the inductance L1 of the signal line 1 to the inductance Ln due to the third and fourth return currents and setting the fourth electronic switch 7d in the ON state.

Also, in the high-delay mode, the third electronic switch 7c is set in the OFF state. That is, in the high-delay mode, no action is taken to intentionally increase the loss of the signal line 1. As a result, the output amplitude of the high-frequency signal in the high-delay mode approaches the output amplitude in the low-delay mode.

In this digital phase shifter A1 according to the first embodiment, in ones adjacent to each other of the digital phase shift circuits $B_1$ to $B_n$ linearly connected in cascade, the outer line 3a and the outer line 3a adjacent to each other face each other with a gap P therebetween and the second outer line 3b and the second outer line 3b adjacent to each other face each other with a gap P therebetween. Also, in ones adjacent to each other of the digital phase shift circuits $B_1$ to $B_n$, the first ground conductor 4a and the second ground conductor 4b adjacent to each other are arranged with a gap P therebetween.

That is, in ones adjacent to each other of the digital phase shift circuits $B_1$ to $B_n$, each pair of the two first outer lines 3a and 3a adjacent to each other and the two second outer lines 3b and 3b adjacent to each other are arranged with a gap P without direct contact. Also, in ones adjacent to each other of the digital phase shift circuits $B_1$ to $B_n$, the first ground conductor 4a and the second ground conductor 4b adjacent to each other are arranged with a gap P without direct contact.

For example, focusing on the first digital phase shift circuit $B_1$, the second digital phase shift circuit $B_2$, and the third digital phase shift circuit $B_3$ shown in FIG. 1, the first outer line 3a in the first digital phase shift circuit $B_1$ and the first outer line 3a in the second digital phase shift circuit $B_2$ have a relationship of being adjacent to each other. Also, the second outer line 3b in the first digital phase shift circuit $B_1$ and the second outer line 3b in the second digital phase shift circuit $B_2$ have a relationship of being adjacent to each other.

Furthermore, the first ground conductor 4a of the first digital phase shift circuit $B_1$ and the second ground conductor 4b of the second digital phase shift circuit $B_2$ have a relationship of being adjacent to each other. For the first digital phase shift circuit $B_1$ and the second digital phase shift circuit $B_2$, each pair of the two first outer lines 3a and 3a, the two second outer lines 3b and 3b, and the first ground conductor 4a and the second ground conductor 4b are arranged with a gap P without contact.

Also, the first outer line 3a in the second digital phase shift circuit $B_2$ and the first outer line 3a in the third digital phase shift circuit $B_3$ have a relationship of being adjacent to each other. Also, the second outer line 3b in the second digital phase shift circuit $B_2$ and the second outer line $3b$ in the third digital phase shift circuit $B_3$ have a relationship of being adjacent to each other.

Furthermore, the first ground conductor $4a$ of the second digital phase shift circuit $B_2$ and the second ground conductor $4b$ of the third digital phase shift circuit $B_3$ have a relationship of being adjacent to each other. For the second digital phase shift circuit $B_2$ and the third digital phase shift circuit $B_3$, each pair of the two first outer lines $3a$ and $3a$, the two second outer lines $3b$ and $3b$, and the first ground conductor $4a$ and the second ground conductor $4b$ are arranged with a gap P without contact.

In this digital phase shifter A1, since each pair of the two first outer lines $3a$ and $3a$ adjacent to each other, the two second outer lines $3b$ and $3b$ adjacent to each other, and the first ground conductor $4a$ and the second ground conductor $4b$ adjacent to each other are not in direct contact with each other, a total net return path (a sum of $4b$, $3b$, and $4b$) per unit during high delay can be lengthened and the inductance value can be increased. In the case of direct contact, return currents in opposite directions flowing through the adjacent second ground conductors $4b$ during high delay cancel each other out and the net return path length of the second ground conductors $4b$ becomes 0 (zero).

Therefore, according to the first embodiment, it is possible to provide the digital phase shifter A1 capable of increasing the inductance value during the high-delay mode as compared with conventional technologies. Therefore, according to the first embodiment, it is possible to increase a difference (a phase shift amount) between the phase during the high-delay mode and the phase during the low-delay mode as compared with conventional technologies.

Figure 3:
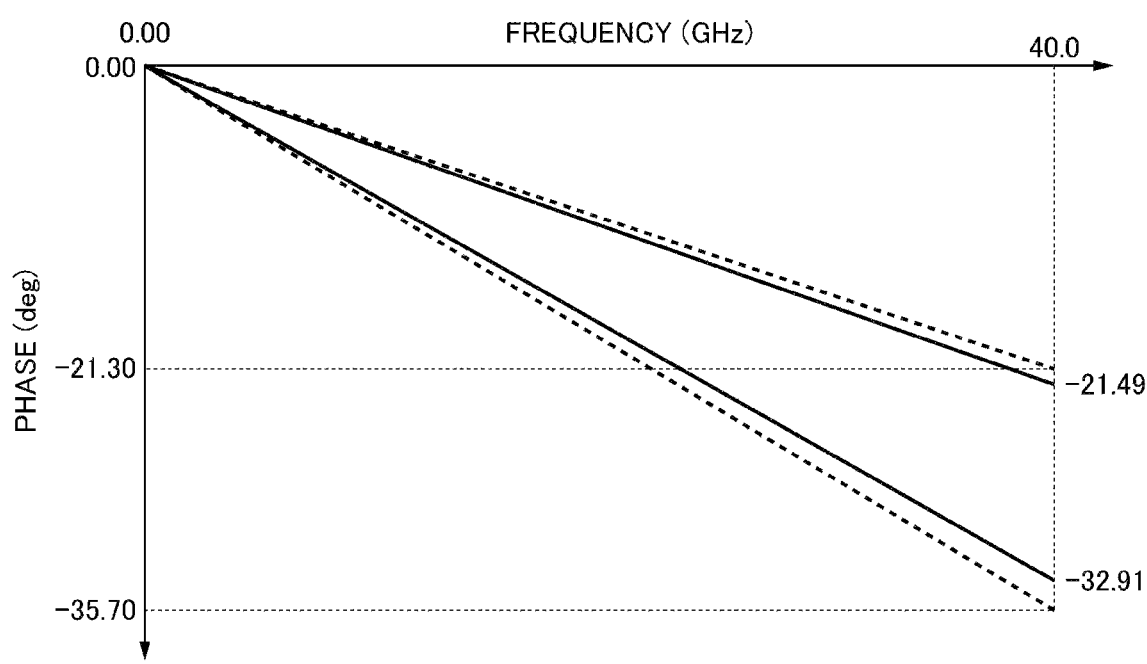
FIG. 3 is a graph showing phase shift characteristics of the digital phase shifter according to the first embodiment of the present invention.

Here, the solid lines in FIG. 3 are a graph showing the phase shift characteristics of the digital phase shifter A1 according to the first embodiment. As shown in FIG. 3, the digital phase shifter A1 according to the first embodiment can ensure a large phase shift amount as the frequency increases. Also, the digital phase shifter A1 according to the first embodiment can sufficiently ensure a difference (a phase shift amount) between the phase during the high-delay mode and the phase during the low-delay mode.

Also, the dotted lines in FIG. 3 indicate a comparative example and are phase shift characteristics when the conductive layer is changed. That is, the dotted lines indicate a phase shift characteristic when the first ground conductor $4a$ is formed in a layer different from that of the second ground conductor $4b$, and the phase shift amount can be further increased than that indicated by the solid lines.

Second Embodiment

Figure 4:
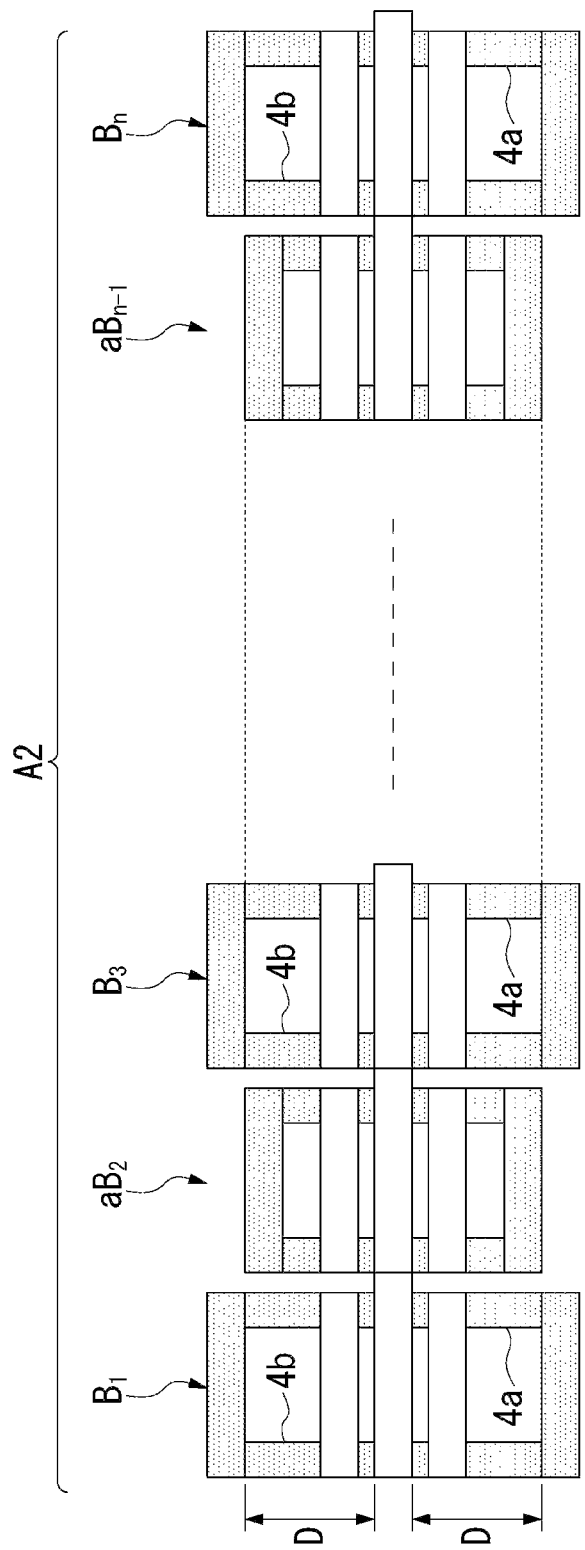
FIG. 4 is a front view showing a configuration of a digital phase shifter according to a second embodiment of the present invention.

Next, a second embodiment of the present invention will be described with reference to FIG. 4. As shown in FIG. 4, in a digital phase shifter A2 according to the second embodiment, between ones adjacent to each other of digital phase shift circuits $B_1$ to $B_n$, the distances from a signal line 1 to a first outer line $3a$ and a second outer line $3b$ in one of the ones are different from those in the other of the ones.

In the digital phase shifter A1 according to the first embodiment, as shown in FIG. 1, between ones adjacent to each other of the digital phase shift circuits $B_1$ to $B_n$, the distances from the signal line 1 to the first outer line $3a$ and the second outer line $3b$ in one of the ones are the same as those in the other of the ones. On the other hand, in the digital phase shifter A2 according to the second embodiment, a first modified digital phase shift circuit aB in which the distances from the signal line 1 to the first outer line $3a$ and the second outer line $3b$ are different from those in a basic digital phase shift circuit B is adopted, and the digital phase shifter A2 has a configuration in which the basic digital phase shift circuit B and the first modified digital phase shift circuit aB are alternately arranged.

That is, in the digital phase shifter A2 according to the second embodiment, as shown in FIG. 4, the basic digital phase shift circuit B is adopted as a first digital phase shift circuit $B_1$, a third digital phase shift circuit $B_3$, . . . , and an $n^{th}$ digital phase shift circuit $B_n$. Also, in the digital phase shifter A2, the first modified digital phase shift circuit aB different from the basic digital phase shift circuit B in positions of the first outer line $3a$ and the second outer line $3b$ with respect to the signal line 1 is adopted as a second digital phase shift circuit $B_2$, . . . , and an $(n-1)^{th}$ digital phase shift circuit $B_{n-1}$.

More specifically, as shown in FIG. 4, the positions of the first outer line $3a$ and the second outer line $3b$ in the first modified digital phase shift circuit aB are closer to the signal line 1 than those of the first outer line $3a$ and the second outer line $3b$ in the basic digital phase shift circuit B. That is, the lengths of a first ground conductor $4a$ and a second ground conductor $4b$ in the first modified digital phase shift circuit aB are shorter than those of a first ground conductor $4a$ and a second ground conductor $4b$ in the basic digital phase shift circuit B.

The distance between the first outer line $3a$ and the first outer line $3a$ adjacent to each other and the distance between the second outer line $3b$ and the second outer line $3b$ adjacent to each other in the digital phase shifter A2 are longer than those in the digital phase shifter A1 according to the first embodiment.

Since each pair of the two first outer lines $3a$ and $3a$ adjacent to each other, the two second outer lines $3b$ and $3b$ adjacent to each other, and the first ground conductor $4a$ and the second ground conductor $4b$ adjacent to each other in the digital phase shifter A2 are not in direct contact with each other and are spaced farther apart from each other than those in the digital phase shifter A1 according to the first embodiment, the inductance value during the high-delay mode in the digital phase shifter A2 can be further increased.

Therefore, according to the second embodiment, it is possible to provide the digital phase shifter A2 capable of further increasing the inductance value during the high-delay mode. Therefore, according to the second embodiment, it is possible to further increase a difference (a phase shift amount) between the phase during the high-delay mode and the phase during the low-delay mode.

Third Embodiment

Figure 5:
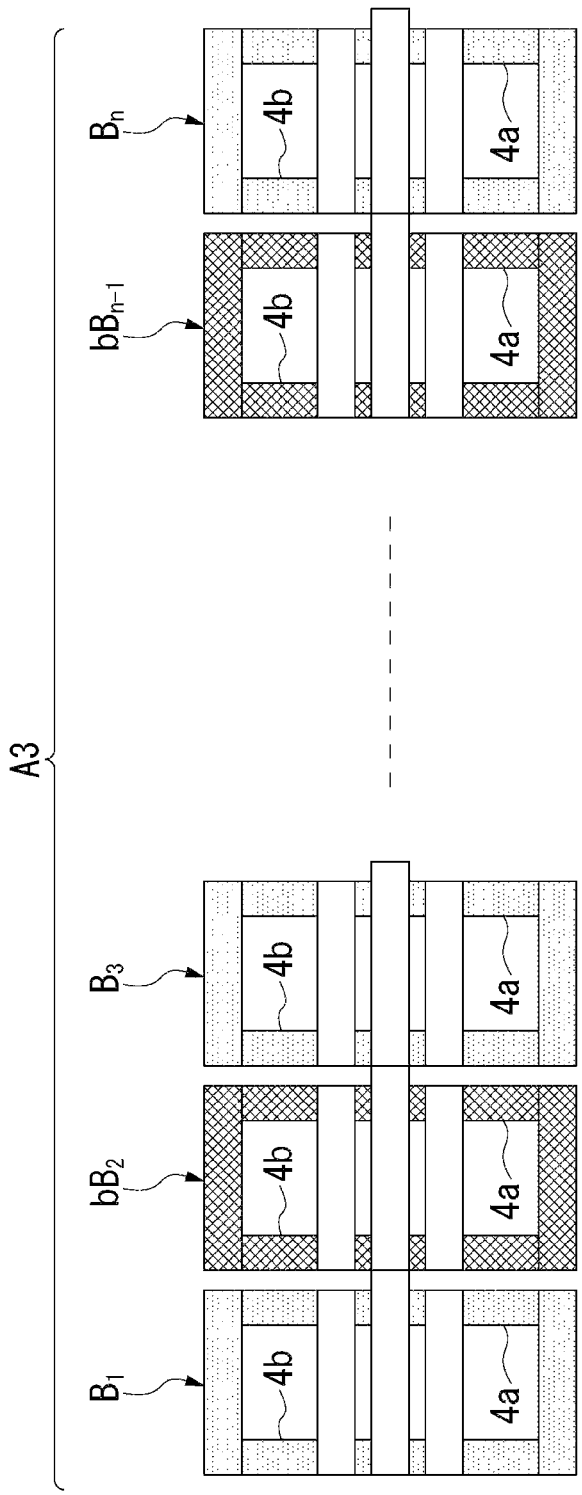
FIG. 5 is a front view showing a configuration of a digital phase shifter according to a third embodiment of the present invention.

Next, a third embodiment of the present invention will be described with reference to FIG. 5. As shown in FIG. 5, in a digital phase shifter A3 according to the third embodiment, between ones adjacent to each other of digital phase shift circuits $B_1$ to $B_n$, each pair of first outer lines $3a$, second outer lines $3b$, first ground conductors $4a$, and second ground conductors $4b$ are formed in different conductive layers.

As described in the first embodiment, the basic digital phase shift circuit B is actually formed as a laminated structure in which a plurality of conductive layers are laminated with an insulating layer sandwiched therebetween. For example, in the basic digital phase shift circuit B, a signal line 1, a first inner line $2a$, a second inner line $2b$, a first outer line $3a$, and a second outer line $3b$ are formed in a first conductive layer, and a first ground conductor $4a$ and a second ground conductor 4b are formed in a second conductive layer facing the first conductive layer in a state in which an insulating layer is sandwiched between the first conductive layer and the second conductive layer.

On the other hand, in the digital phase shifter A3 according to the third embodiment, in addition to the basic digital phase shift circuit B, a second modified digital phase shift circuit bB in which a conductive layer thereof is different from that of the basic digital phase shift circuit B is adopted, and the digital phase shifter A3 has a configuration in which the basic digital phase shift circuit B and the second modified digital phase shift circuit bB are alternately arranged.

That is, as shown in FIG. 5, in the digital phase shifter A3 according to the third embodiment, the basic digital phase shift circuit B is adopted as a first digital phase shift circuit $B_1$, a third digital phase shift circuit $B_3$, ..., and an $n^{th}$ digital phase shift circuit $B_n$. Also, in the digital phase shifter A3, the second modified digital phase shift circuit bB in which a conductive layer thereof is different from that of the basic digital phase shift circuit B is adopted as a second digital phase shift circuit $B_2$, ..., and an $(n-1)^{th}$ digital phase shift circuit $B_{n-1}$.

More specifically, in the second modified digital phase shift circuit bB, the first outer line 3a and the second outer line 3b are formed in a conductive layer different from a conductive layer in which the first outer line 3a and the second outer line 3b of the basic digital phase shift circuit B are formed. Also, in the second modified digital phase shift circuit bB, the first ground conductor 4a and the second ground conductor 4b are formed in a conductive layer different from a conductive layer in which the first ground conductor 4a and the second ground conductor 4b of the basic digital phase shift circuit B are formed.

In the digital phase shifter A3, since each pair of the two first outer lines 3a and 3a adjacent to each other, the two second outer lines 3b and 3b adjacent to each other, and the first ground conductor 4a and the second ground conductor 4b adjacent to each other are not in direct contact with each other and are spaced farther apart from each other than those in the digital phase shifter A1 according to the first embodiment, the inductance value during the high-delay mode can be further increased.

Therefore, according to the third embodiment, it is possible to increase the inductance value during the high-delay mode as compared with that of the digital phase shifter A1 according to the first embodiment. Also, as a result, it is possible to increase a difference (a phase shift amount) between the phase during the high-delay mode and the phase during the low-delay mode as compared with that of the digital phase shifter A1.

Fourth Embodiment

Figure 6:
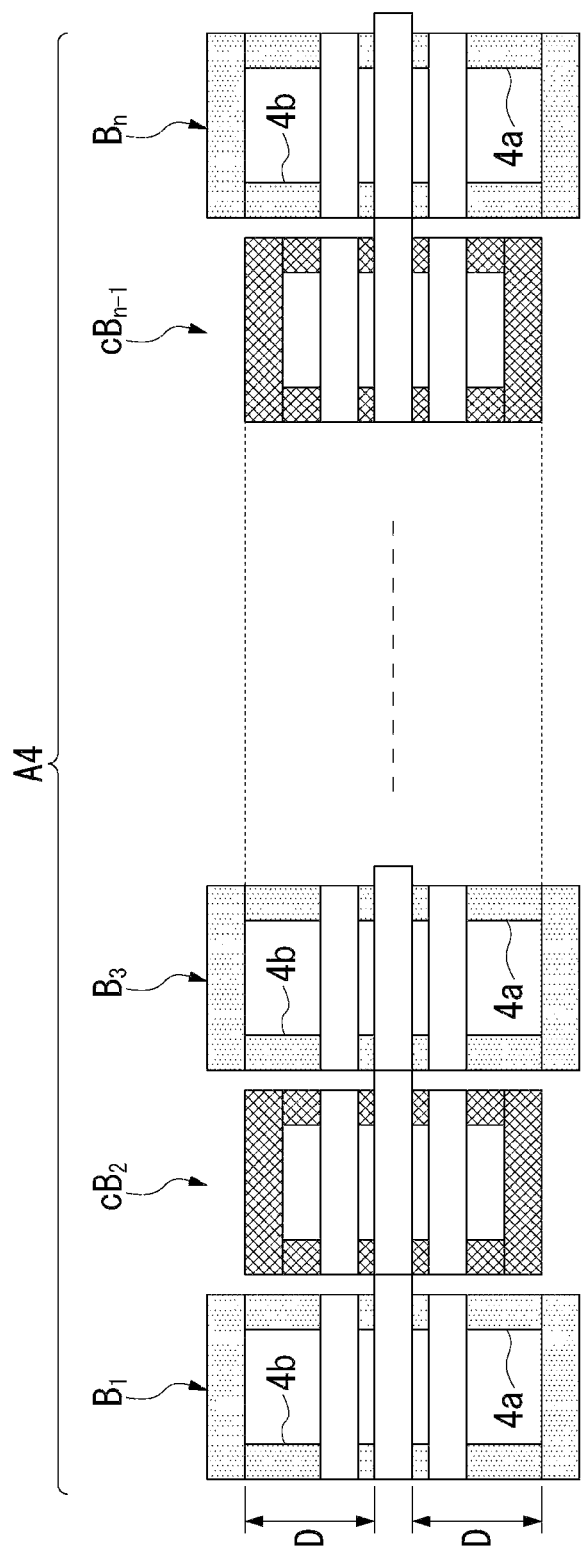
FIG. 6 is a front view showing a configuration of a digital phase shifter according to a fourth embodiment of the present invention.

Next, a fourth embodiment of the present invention will be described with reference to FIG. 6. As shown in FIG. 6, a digital phase shifter A4 according to the fourth embodiment has both of the structural feature of the digital phase shifter A2 according to the second embodiment and the structural feature of the digital phase shifter A3 according to the third embodiment.

In addition to a basic digital phase shift circuit B, the digital phase shifter A4 adopts a third modified digital phase shift circuit cB in which the distances from a signal line 1 to a first outer line 3a and a second outer line 3b are different from those of the basic digital phase shift circuit B and the first outer line 3a, the second outer line 3b, a first ground conductor 4a, and a second ground conductor 4b are formed in a different conductive layer from that of the basic digital phase shift circuit B. Also, the digital phase shifter A4 has a configuration in which the basic digital phase shift circuit B and the third modified digital phase shift circuit cB are alternately arranged.

That is, as shown in FIG. 6, in the digital phase shifter A4 according to the fourth embodiment, the basic digital phase shift circuit B is adopted as a first digital phase shift circuit $B_1$, a third digital phase shift circuit $B_3$, ..., and an $n^{th}$ digital phase shift circuit $B_n$. Also, in the digital phase shifter A4, the third modified digital phase shift circuit cB is adopted as a second digital phase shift circuit $B_2$, ..., and an $(n-1)^{th}$ digital phase shift circuit $B_{n-1}$.

In the digital phase shifter A4, since each pair of the two first outer lines 3a and 3a adjacent to each other, the two second outer lines 3b and 3b adjacent to each other, and the first ground conductor 4a and the second ground conductor 4b adjacent to each other are not in direct contact with each other and are spaced farther apart from each other than those in the digital phase shifter A2 according to the second embodiment and the digital phase shifter A3 according to the third embodiment, the inductance value during the high-delay mode can be further increased.

Therefore, according to the fourth embodiment, it is possible to provide the digital phase shifter A4 capable of further increasing the inductance value during the high-delay mode. Thus, according to the fourth embodiment, it is possible to further increase a difference (a phase shift amount) between the phase during the high-delay mode and the phase during the low-delay mode.

Fifth Embodiment

Figure 7:
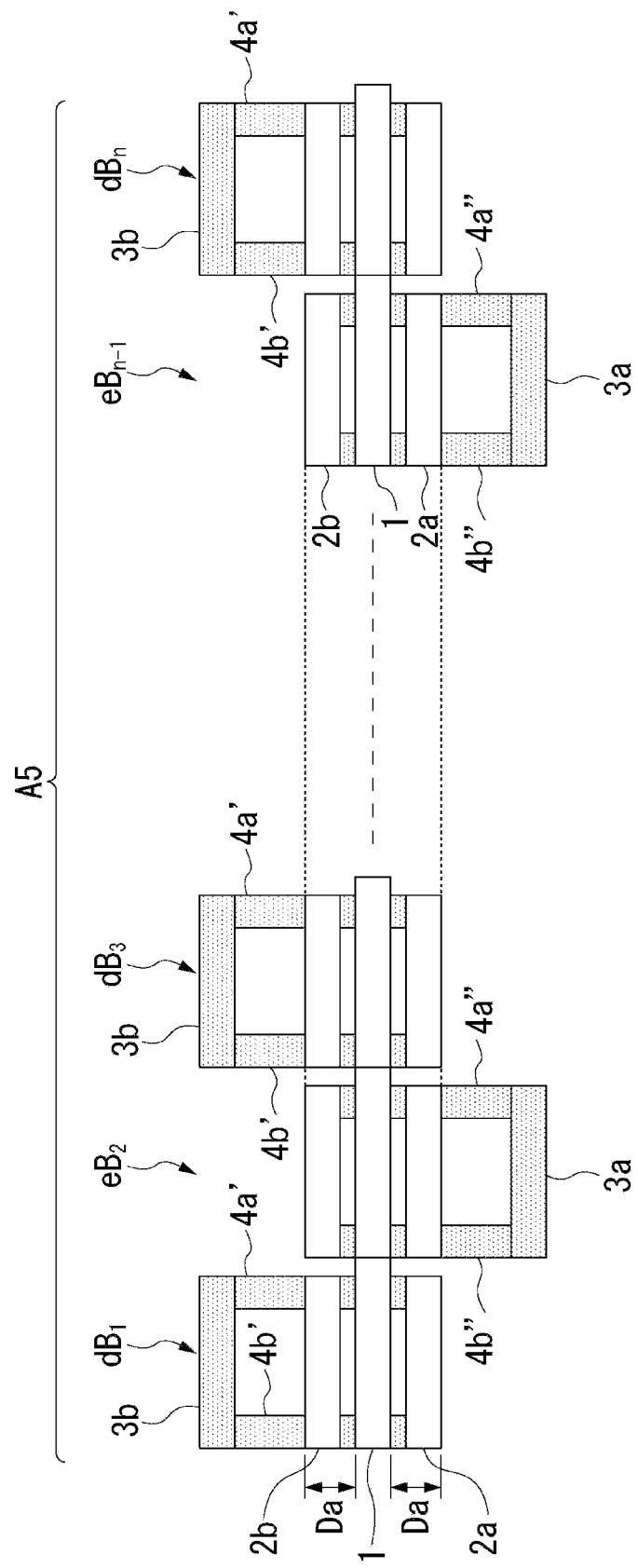
FIG. 7 is a front view showing a configuration of a digital phase shifter according to a fifth embodiment of the present invention.

Next, a fifth embodiment of the present invention will be described with reference to FIG. 7. As shown in FIG. 7, a digital phase shifter A5 according to the fifth embodiment has a configuration in which one of a first outer line 3a and a second outer line 3b (two outer lines) is deleted such that positional relationships with respect to a signal line 1 are reversed from each other between ones adjacent to each other of digital phase shift circuits $B_1$ to $B_n$. Also, in the digital phase shifter A5, the lengths of a first ground conductor 4a and a second ground conductor 4b are set to be shortened in accordance with the deletion of one of the first outer line 3a and the second outer line 3b.

As shown in FIG. 7, in the digital phase shifter A5, a fourth modified digital phase shift circuit dB and a fifth modified digital phase shift circuit eB are adopted and are alternately arranged. That is, in the digital phase shifter A5, the fourth modified digital phase shift circuit dB is adopted as a first digital phase shift circuit $B_1$, a third digital phase shift circuit $B_3$, ..., and an $n^{th}$ digital phase shift circuit $B_n$. Also, in the digital phase shifter A5, the fifth modified digital phase shift circuit eB is adopted as a second digital phase shift circuit $B_2$ ..., and an $(n-1)^{th}$ digital phase shift circuit $B_{n-1}$.

The fourth modified digital phase shift circuit dB has a configuration in which, between a first outer line 3a and a second outer line 3b in a basic digital phase shift circuit B, the first outer line 3a is deleted. Also, the fourth modified digital phase shift circuit dB includes a first ground conductor 4a' and a second ground conductor 4b' shorter than a first ground conductor 4a and a second ground conductor 4b in the basic digital phase shift circuit B in accordance with the deletion of the first outer line 3a. The first ground conductor 4a' and the second ground conductor 4b' extend from the outer edge portion of the second outer line 3b to the outer edge portion of the first inner line 2a as shown in the drawing.

The fifth modified digital phase shift circuit eB has a configuration in which, between the first outer line 3a and the second outer line 3b in the basic digital phase shift circuit B, the second outer line 3b is deleted. Also, the fifth modified digital phase shift circuit eB includes a first ground conductor 4a'' and a second ground conductor 4b'' shorter than the first ground conductor 4a and the second ground conductor 4b in the basic digital phase shift circuit B in accordance with the deletion of the second outer line 3b. These first ground conductors 4a'' and the second ground conductors 4b'' extend from the outer edge portion of the first outer line 3a and the outer edge portion of the second inner line 2b as shown in the drawing.

In this digital phase shifter A5, there are no two first outer lines 3a and 3a adjacent to each other and there are no two second outer lines 3b and 3b adjacent to each other between ones adjacent to each other of the digital phase shift circuits $B_1$ to $B_n$. Also, parts adjacent to each other of the first ground conductor 4a and the second ground conductor 4b are located only between the first inner line 2a and the second inner line 2b. Therefore, the inductance value during the high-delay mode can be increased.

Therefore, according to the fifth embodiment, the inductance value during the high-delay mode can be increased as compared with that of the digital phase shifter A2 according to the second embodiment. As a result, according to the fifth embodiment, a difference (a phase shift amount) between the phase during the high-delay mode and the phase during the low-delay mode can be increased as compared with that of the digital phase shifter A1.

Sixth Embodiment

Figure 8:
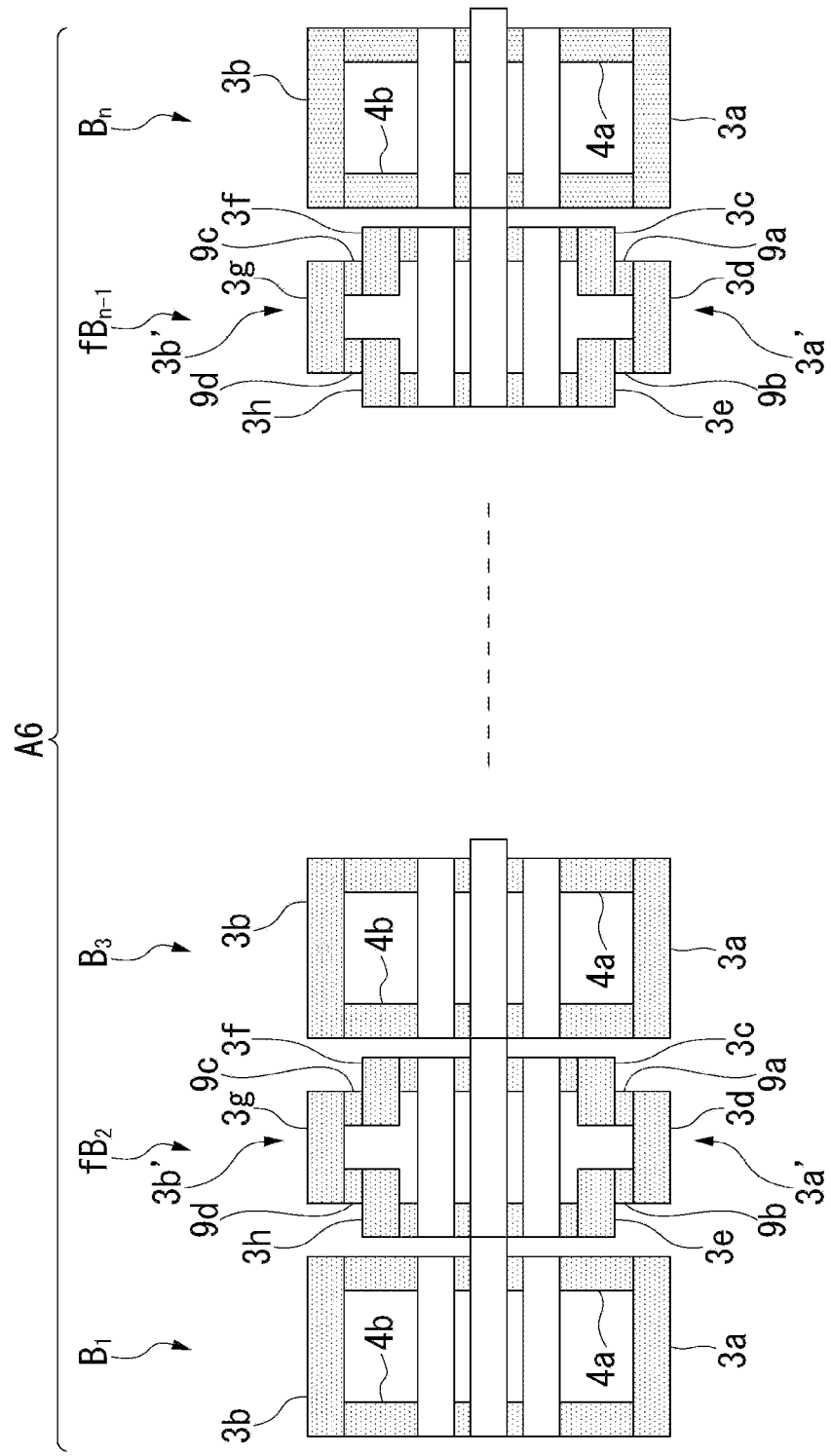
FIG. 8 is a front view showing a configuration of a digital phase shifter according to a sixth embodiment of the present invention.

Next, a sixth embodiment of the present invention will be described with reference to FIG. 8. As shown in FIG. 8, in a digital phase shifter A6 according to the sixth embodiment, one of ones adjacent to each other of digital phase shift circuits $B_1$ to $B_n$ includes a first outer line 3a' and a second outer line 3b' obtained by connecting a plurality of individual lines 3c to 3h having different distances from a signal line 1.

That is, the digital phase shifter A6 adopts, in addition to a basic digital phase shift circuit A, a sixth modified digital phase shift circuit fB including the first outer line 3a' and the second outer line 3b' in which the plurality of individual lines 3c to 3h having different distances from the signal line 1 are connected. Also, the digital phase shifter A6 has a configuration in which the basic digital phase shift circuit B and the third modified digital phase shift circuit cB are alternately arranged.

As shown in FIG. 8, in the digital phase shifter A6 according to the sixth embodiment, the basic digital phase shift circuit B is adopted as a first digital phase shift circuit $B_1$, a third digital phase shift circuit $B_3$, . . . , and an $n^{th}$ digital phase shift circuit $B_n$. Also, in the digital phase shifter A6, the sixth modified digital phase shift circuit fB is adopted as a second digital phase shift circuit $B_2$, . . . , and an $(n-1)^{th}$ digital phase shift circuit $B_{n-1}$.

In the sixth modified digital phase shift circuit fB, the first outer line 3a' is configured by connecting three individual lines 3c to 3e using two connection lines 9a and 9b. The three individual lines 3c to 3e are linear strip-shaped conductors extending in the same direction as the signal line 1.

Among the three individual lines 3c to 3e, two individual lines 3c and 3e are arranged at the same distance from the signal line 1 as shown in the drawing. Between the two individual lines 3c and 3e, one individual line 3c has one end connected to a first ground conductor 4a and the other end connected to one end of one connection line 9a. Also, the other individual line 3e has one end connected to a second ground conductor 4b and the other end connected to one end of the other connection line 9b.

The remaining individual line 3d is arranged in a position farther from the signal line 1 than the two individual lines 3c and 3e and has one end connected to the other end of the one connection line 9a and the other end connected to one end of the other connection line 9b. The two connection lines 9a and 9b are linear strip-shaped conductors extending in the same direction as the first ground conductor 4a and the second ground conductor 4b.

That is, in the first outer line 3a', the three individual lines 3c to 3e and the two connection lines 9a and 9b are connected in the order of individual line 3c→connection line 9a→individual line 3d→connection line 9b→individual line 3e.

On the other hand, the second outer line 3b' is configured by connecting three individual lines 3f to 3h using two connection lines 9c and 9d. The three individual lines 3f to 3h are linear strip-shaped conductors extending in the same direction as the signal line 1.

Among the three individual lines 3f to 3h, two individual lines 3f and 3h are arranged at the same distance from the signal line 1 as shown in the drawing. Between the two individual lines 3f and 3h, one individual line 3f has one end connected to the first ground conductor 4a and the other end connected to one end of one connection line 9c. Also, the other individual line 3h has one end connected to the second ground conductor 4b and the other end connected to one end of the other connection line 9d.

The remaining individual line 3g is arranged in a position farther from the signal line 1 than the two individual lines 3f and 3h and has one end connected to the other end of the one connection line 9c and the other end connected to the other end of the other connection line 9d. The two connection lines 9c and 9d are linear strip-shaped conductors extending in the same direction as the first ground conductor 4a and the second ground conductor 4b.

That is, in the second outer line 3b', the three individual lines 3f to 3h and the two connection lines 9c and 9d are connected in the order of individual line 3f→connection line 9c→individual line 3g→connection line 9d→individual line 3h.

In the digital phase shifter A6, the distances between the two first outer lines 3a and 3a adjacent to each other and between the two second outer lines 3b and 3b adjacent to each other are longer than those in the digital phase shifter A1 of the first embodiment. Also, in the first ground conductor 4a and the second ground conductor 4b adjacent to each other, since the first ground conductor and the second ground conductor of the sixth modified digital phase shift circuit fB are shorter than the first ground conductor and the second ground conductor of the basic digital phase shift circuit B, adjacent parts therebetween are small as compared with those of the digital phase shifter A1 of the first embodiment. Therefore, it is possible to increase the inductance value during the high-delay mode.

Therefore, according to the sixth embodiment, it is possible to provide the digital phase shifter A6 capable of increasing the inductance value during the high-delay mode. Thus, according to the sixth embodiment, it is possible to further increase a difference (a phase shift amount) between the phase during the high-delay mode and the phase during the low-delay mode.

Seventh Embodiment

Next, a seventh embodiment of the present invention will be described with reference to FIG. 9. A digital phase shifter A7 according to the seventh embodiment corresponds to a modification of the third embodiment.

As described above, in the digital phase shifter A3 according to the third embodiment, between ones adjacent to each other of the digital phase shift circuits $B_1$ to $B_n$, each pair of the first outer lines 3a, and the second outer lines 3b, in addition to the first ground conductor 4a and the second ground conductor 4b, are formed in different conductive layers. On the other hand, the digital phase shifter A7 according to the seventh embodiment has a configuration in which only a first ground conductor 4a and a second ground conductor 4b are formed in different conductive layers between ones adjacent to each other of digital phase shift circuits B to $B_n$.

Figure 9:
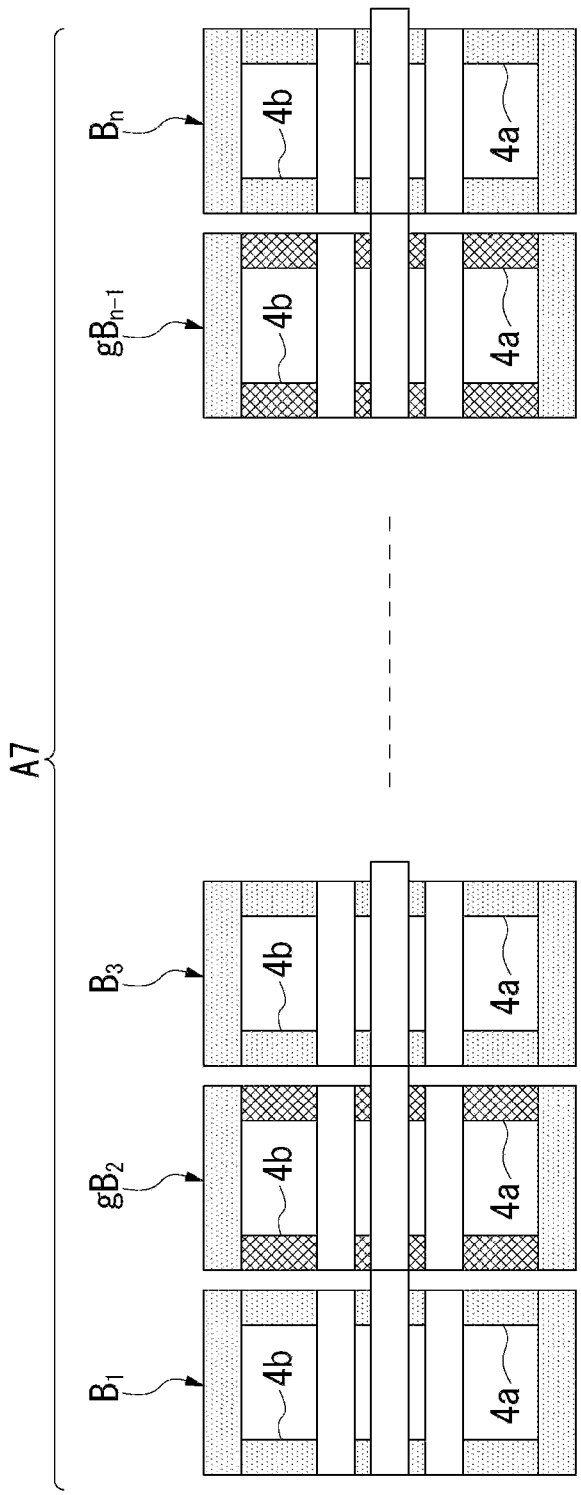
FIG. 9 is a front view showing a configuration of a digital phase shifter according to a seventh embodiment of the present invention.

As shown in FIG. 9, the digital phase shifter A7 adopts a basic digital phase shift circuit B and a seventh modified digital phase shift circuit gB and has a configuration in which the basic digital phase shift circuit B and the seventh modified digital phase shift circuit gB are alternately arranged. That is, in the digital phase shifter A7, the basic digital phase shift circuit B is adopted as a first digital phase shift circuit $B_1$, a third digital phase shift circuit $B_3$, . . . , and an $n^{th}$ digital phase shift circuit $B_n$. Also, in the digital phase shifter A7, the seventh modified digital phase shift circuit gB is adopted as a second digital phase shift circuit $B_2$, . . . , and an $(n-1)^{th}$ digital phase shift circuit $B_{n-1}$.

In the seventh modified digital phase shift circuit gB, a signal line 1, a first inner line 2a, a second inner line 2b, a first outer line 3a, and a second outer line 3b are formed in a first conductive layer. Also, in the seventh modified digital phase shift circuit gB, the first ground conductor 4a and the second ground conductor 4b are formed in a second conductive layer facing the first conductive layer in a state in which an insulating layer is sandwiched therebetween.

According to the digital phase shifter A7 of the seventh embodiment, since the first ground conductor 4a and the second ground conductor 4b adjacent to each other are formed in different conductive layers, the inductance value during the high-delay mode can be further increased approximately similarly to the digital phase shifter A3 according to the third embodiment.

Therefore, according to the seventh embodiment, a difference (a phase shift amount) between the phase during the high-delay mode and the phase during the low-delay mode can be increased as compared with the digital phase shifter A1 of the first embodiment.

Eighth Embodiment

Figure 10:
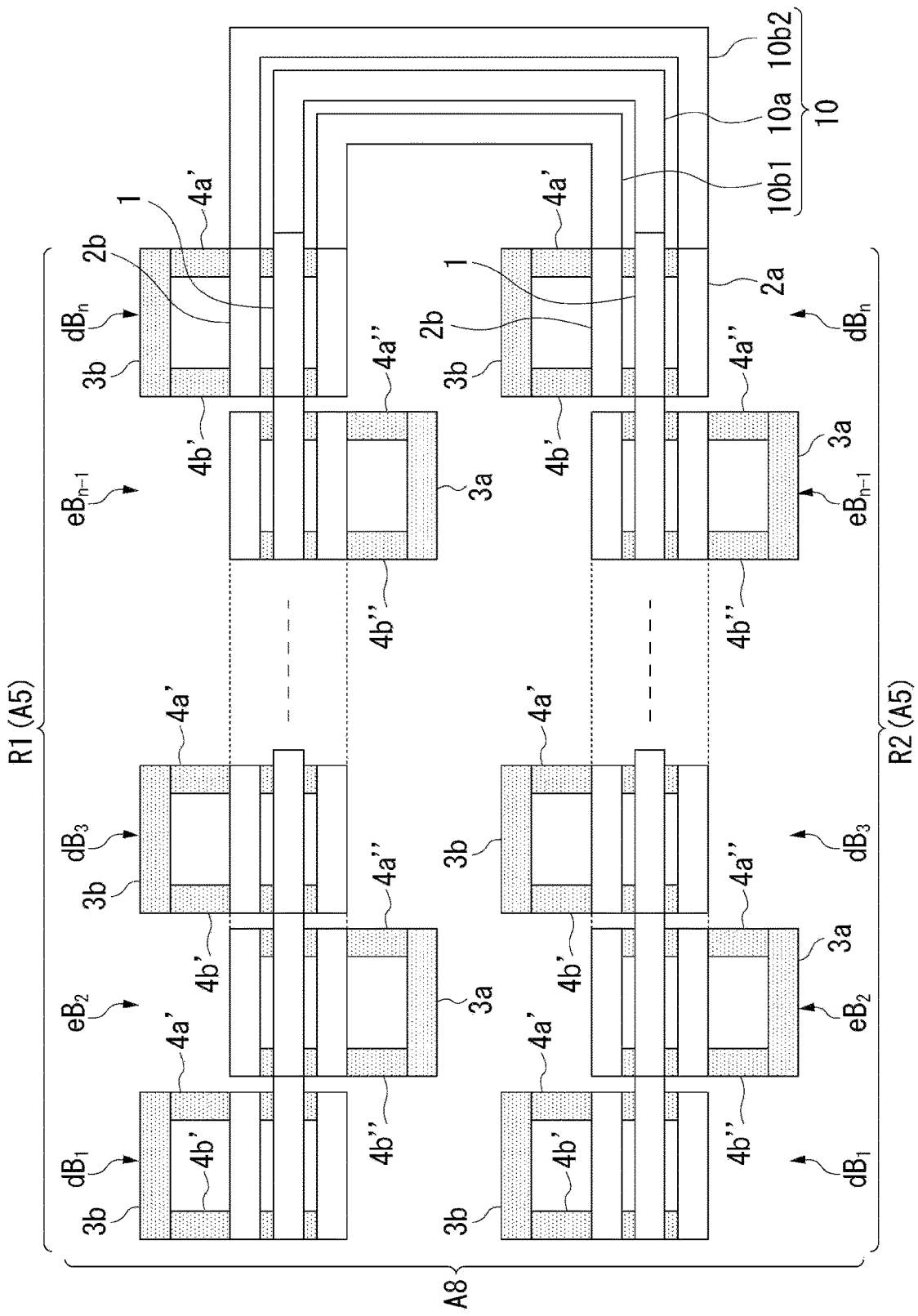
FIG. 10 is a front view showing a configuration of a digital phase shifter according to an eighth embodiment of the present invention.

Next, an eighth embodiment of the present invention will be described with reference to FIG. 10. A digital phase shifter A8 according to the eighth embodiment corresponds to a modification of the fifth embodiment.

The digital phase shifter A8 has a configuration in which two digital phase shifters A5 according to the fifth embodiment are arranged in parallel and one ends thereof are electrically connected by a connection unit 10. In the eighth embodiment, one of the two digital phase shifters A5 arranged in parallel is referred to as a first row R1 and the other thereof is referred to as a second row R2. The second row R2 is arranged to overlap the first row R1 viewed in a direction (an upward/downward direction of the drawing) orthogonal to a direction in which the first row R1 extends.

The connection unit 10 has a U-shape that is convex in a direction in which the first row R1 and the second row R2 extend and connects an n digital phase shift circuit $dB_n$ included in the first row R1 and an $n^{th}$ digital phase shift circuit $dB_n$ included in the second row R2. The U-shaped connection unit 10 is arranged to open toward the first row R1 and the second row R2. Specifically, the connection unit 10 constitutes a so-called coplanar line and includes a signal line connection path 10a and two ground line connection paths 10b1 and 10b2 arranged at intervals on both sides of the signal line connection path 10a.

The signal line connection path 10a connects a signal line 1 included in the first row R1 and a signal line 1 included in the second row R2. The first ground line connection path 10b1 connects a first inner line 2a included in the $n^{th}$ digital phase shift circuit $dB_n$ of the first row R1 and a second inner line 2b included in the $n^{th}$ digital phase shift circuit $dB_n$ of the second row R2. The second ground line connection path 10b2 connects a second inner line 2b included in the $n^{th}$ digital phase shift circuit $dB_n$ of the first row R1 and a first inner line 2a included in the $n^{th}$ digital phase shift circuit $dB_n$ of the second row R2. Also, the connection unit 10 may constitute a so-called grounded coplanar line or a microstrip line.

Also, in the digital phase shifter A8 according to the eighth embodiment, the first row R1 and the second row R2 are arranged such that a plurality of outer lines 3a and 3b included in the first row R1 are not adjacent to (do not face) a plurality of outer lines 3a and 3b included in the second row R2 in a direction (an upward/downward direction of the drawing) orthogonal to a direction in which the first row R1 and the second row R2 extend. For example, the second outer line 3b included in a first digital phase shift circuit $dB_1$ of the second row R2 and the first outer line 3a included in a second digital phase shift circuit $eB_2$ of the first row R1 are in different positions in a direction (a left/right direction of the drawing) in which the first row R1 and the second row R2 extend. Also, the first outer line 3a included in the second digital phase shift circuit $eB_2$ of the first row R1 and the second outer line 3b included in a third digital phase shift circuit $dB_3$ of the second row R2 are in different positions in a direction (a left/right direction of the drawing) in which the first row R1 and the second row R2 extend.

According to the digital phase shifter A8 according to the eighth embodiment, since the two digital phase shifters A5 according to the fifth embodiment are connected, the inductance value during the high-delay mode can be further increased. Also, since the outer lines 3a and 3b are not adjacent to each other and are separated from each other between the first row R1 and the second row R2, it is possible to mitigate electromagnetic interference between the outer lines and to mitigate an influence on the phase shift amount.

Therefore, according to the eighth embodiment, it is possible to further increase a difference (a phase shift amount) between the phase during the high-delay mode and the phase during the low-delay mode as compared with the digital phase shifter A1 of the first embodiment.

Also, in the digital phase shifter A8 according to the eighth embodiment, the outer lines 3a and 3b may be formed in the same conductive layer as the inner lines 2a and 2b or may be formed in a conductive layer different from that of the inner lines 2a and 2b.

Ninth Embodiment

Next, a ninth embodiment of the present invention will be described with reference to FIG. 11. A digital phase shifter A9 according to the ninth embodiment adopts, in addition to a basic digital phase shift circuit B, an eighth modified digital phase shift circuit hB in which two outer lines 3a and 3b and two ground conductors 4a and 4b are replaced with two loop ground conductors 11a and 11b. The digital phase shifter A9 has a configuration in which the basic digital phase shift circuit B and the eighth modified digital phase shift circuit hB are alternately arranged.

Figure 11:
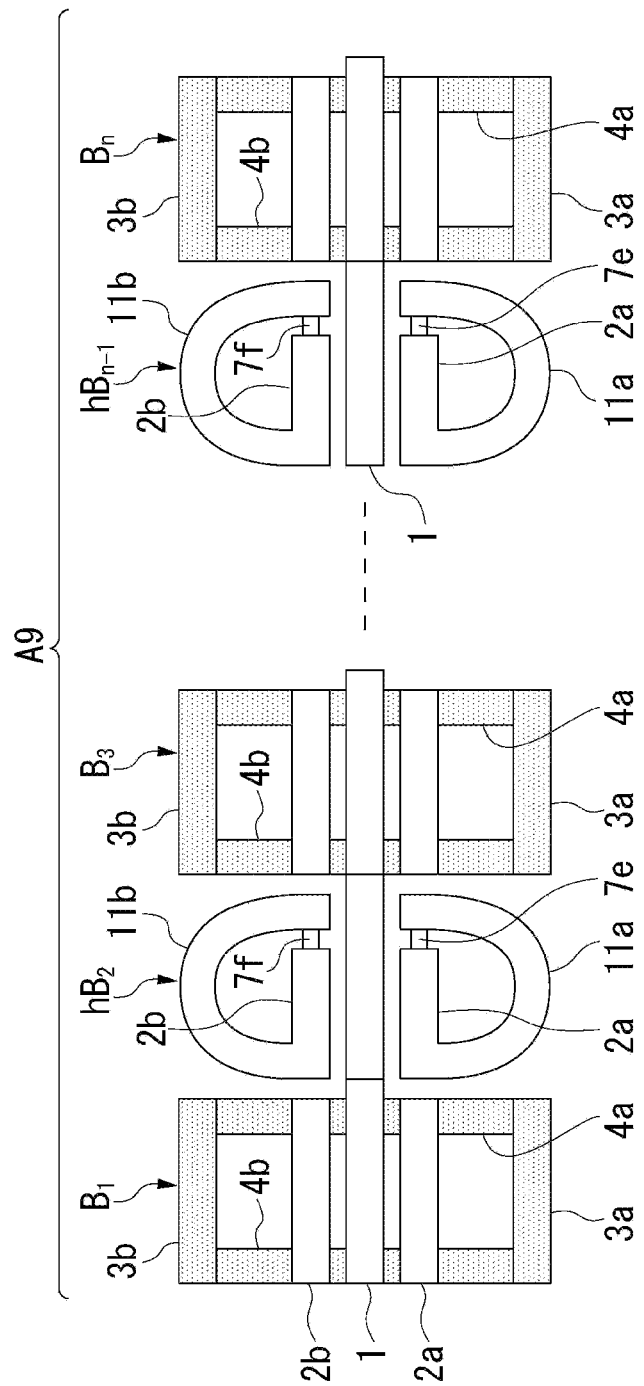
FIG. 11 is a front view showing a configuration of a digital phase shifter according to a ninth embodiment of the present invention.

That is, as shown in FIG. 11, in the digital phase shifter A9 according to the ninth embodiment, the basic digital phase shift circuit B is adopted as a first digital phase shift circuit $B_1$, a third digital phase shift circuit $B_3$, . . . , and an $n^{th}$ digital phase shift circuit $B_n$. Also, in the digital phase shifter A9, the eighth modified digital phase shift circuit hB including the two loop ground conductors 11a and 11b is adopted as a second digital phase shift circuit $B_2$, . . . , and an $(n-1)^{th}$ digital phase shift circuit $B_{n-1}$.

In the eighth modified digital phase shift circuit hB, the first loop ground conductor 11a is a strip-shaped conductor extending in a curvilinear shape. One end of the first loop ground conductor 11a is connected to one end of a first inner line 2a. That is, the first loop ground conductor 11a is a curvilinear plate-shaped conductor having a certain width, a certain thickness, and a predetermined length and has a U-shape protruding toward the outside of the first inner line 2a (a lower side of the drawing). The U-shaped first loop ground conductor 11a is arranged to open toward the first inner line 2a. Also, the first loop ground conductor 11a is electrically grounded.

The second loop ground conductor 11b is a strip-shaped conductor extending in a curvilinear shape. One end of the second loop ground conductor 11b is connected to one end of a second inner line 2b. That is, the second loop ground conductor 11b is a curvilinear plate-shaped conductor having a certain width, a certain thickness, and a predetermined length and has a U-shape protruding toward the outside of the second inner line 2b (an upper side of the drawing). The U-shaped second loop ground conductor 11b is arranged to open toward the second inner line 2b. Also, the second loop ground conductor 11b is electrically grounded.

A fifth electronic switch 7e is provided between the other end of the first loop ground conductor 11a and the other end of the first inner line 2a. The fifth electronic switch 7e is a transistor that connects the other end of the first loop ground conductor 11a and the other end of the first inner line 2a so as to be able to open and close therebetween. This electronic switch is a MOS-type FET similar to the above-described first to fourth electronic switches 7a to 7d and has a drain terminal connected to the other end of the first inner line 2a, a source terminal connected to the other end of the first loop ground conductor 11a, and a gate terminal connected to a switch controller 8.

The fifth electronic switch 7e switches the conductive state between the drain terminal and the source terminal to an open state or a closed state on the basis of a gate signal input from the switch controller 8 to the gate terminal. That is, the fifth electronic switch 7e turns ON/OFF a connection between the other end of the first inner line 2a and the other end of the first loop ground conductor 11a through the switch controller 8.

A sixth electronic switch 7f is provided between the other end of the second loop ground conductor 11b and the other end of the second inner line 2b. The sixth electronic switch 7f is a transistor that connects the other end of the second loop ground conductor 11b and the other end of the second inner line 2b so as to be able to open and close therebetween. This electronic switch is a MOS type FET similar to the above-described first to fifth electronic switches 7a to 7e and has a drain terminal connected to the other end of the second inner line 2b, a source terminal connected to the other end of the second loop ground conductor 11b, and a gate terminal connected to the switch controller 8.

The sixth electronic switch 7f switches the conductive state between the drain terminal and the source terminal to an open state or a closed state on the basis of a gate signal input from the switch controller 8 to the gate terminal. That is, the sixth electronic switch 7f turns ON/OFF a connection between the other end of the second inner line 2b and the other end of the second loop ground conductor 11b through the switch controller 8.

In the eighth modified digital phase shift circuit hB, similarly to the basic digital phase shift circuit B, the operation mode is switched in accordance with the conductive states of the fifth electronic switch 7e and the sixth electronic switch 7f. That is, the operation modes of the eighth modified digital phase shift circuit hB include a low-delay mode in which both of the fifth electronic switch 7e and the sixth electronic switch 7f are set in the ON state by the switch controller 8 and a high-delay mode in which both of the fifth electronic switch 7e and the sixth electronic switch 7f are set in the OFF state by the switch controller 8.

That is, during the low-delay mode, a first return current flows through the first inner line 2a and a second return current flows through the second inner line 2b similarly to the basic digital phase shift circuit B. On the other hand, during the high-delay mode, a third return current flows through the first loop ground conductor 11a and a fourth return current flows through the second loop ground conductor 11b. A difference (a phase shift amount) occurs between the phase during the high-delay mode and the phase during the low-delay mode due to a difference between a change in inductance L1 caused by the first return current and the second return current and a change in the inductance L1 caused by the third return current and the fourth return current, or the like.

Also, in the digital phase shifter A9 according to the ninth embodiment, in the basic digital phase shift circuit B and the eighth modified digital phase shift circuit hB that are linearly connected in cascade and are adjacent to each other, the first outer line 3a and the first loop ground conductor 11a adjacent to each other are separated and the second outer line 3b and the second loop ground conductor 11b are separated. Also, in the digital phase shifter A9, each pair of the first ground conductor 4a and the loop ground conductor 11a adjacent to each other and the first ground conductor 4a and the loop ground conductor 11b adjacent to each other are separated, and each pair of the second ground conductor 4b and the loop ground conductor 11a adjacent to each other and the second ground conductor 4b and the loop ground conductor 11b adjacent to each other are separated. This is because the loop ground conductor of the eighth modified digital phase shift circuit hB has a U-shape.

According to the digital phase shifter A9, a distance between the loop ground conductor 11a and the outer line 3a, a distance between the loop ground conductor 11b and the outer line 3b, a distance between the loop ground conductor 11a and the ground conductor 4a, a distance between the loop ground conductor 11a and the ground conductor 4b, a distance between the loop ground conductor 11b and the ground conductor 4a, and a distance between the loop ground conductor 11b and the ground conductor 4b can be secured, and the inductance value during the high-delay mode can be increased.

Also, in the digital phase shifter A9 according to the ninth embodiment, the loop ground conductors 11a and 11b may be formed in the same conductive layer as the inner lines 2a and 2b or may be formed in a conductive layer different from that of the inner lines 2a and 2b. When the loop ground conductors 11a and 11b are formed in a conductive layer different from that of the inner lines 2a and 2b, between one end of the inner line 2a and one end of the loop ground conductor 11a and between one end of the inner line 2b and one end of the loop ground conductor 11b, connection conductors extending in an upward/downward direction similarly to the first to seventh connection conductors 6a to 6g may connect.

Also, each of the loop ground conductors 11a and 11b may not extend in a curvilinear shape or may have a shape in which a plurality of linearly extending conductors are connected. Alternatively, each loop ground conductor may have a shape obtained by appropriately combining and connecting a curvilinearly extending conductor and a linearly extending conductor.

Tenth Embodiment

Next, a tenth embodiment of the present invention will be described with reference to FIG. 12. A digital phase shifter A10 according to the tenth embodiment has a configuration in which in the digital phase shifter A10 according to the ninth embodiment, one of two outer lines 3a and 3b included in each basic digital phase shift circuit B is deleted and one of two loop ground conductors 11a and 11b included in each eighth modified digital phase shift circuit hB is deleted.

Figure 12:
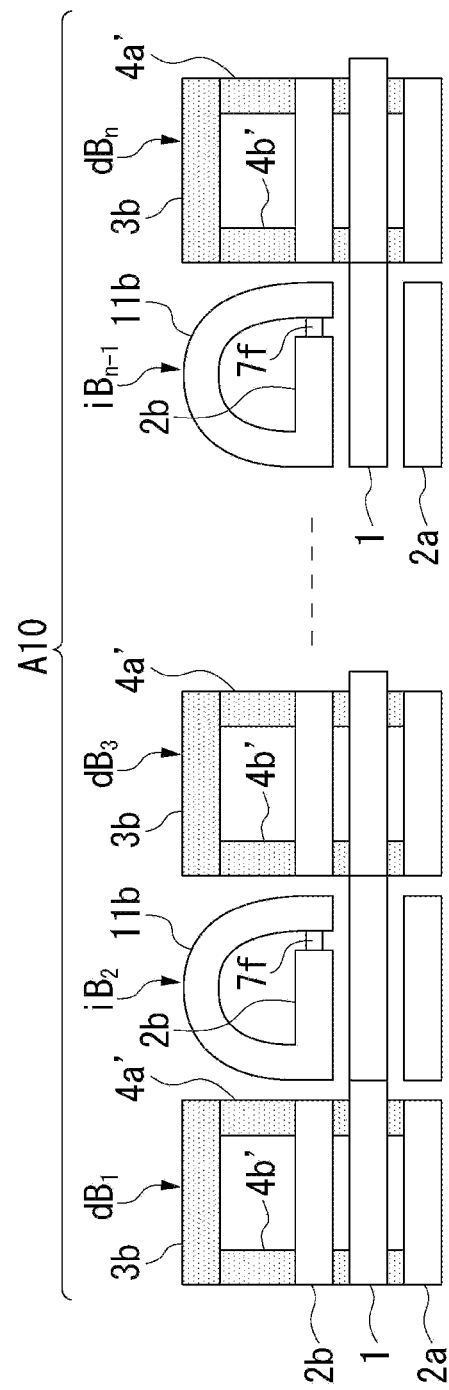
FIG. 12 is a front view showing a configuration of a digital phase shifter according to a tenth embodiment of the present invention.

As shown in FIG. 12, in the digital phase shifter A10, a fourth modified digital phase shift circuit dB and a ninth modified digital phase shift circuit iB are alternately arranged. That is, in the digital phase shifter A10, the fourth modified digital phase shift circuit dB is adopted as a first digital phase shift circuit $B_1$, a third digital phase shift circuit $B_3$, . . . , and an $n^{th}$ digital phase shift circuit $B_n$. Also, in the digital phase shifter A10, the ninth modified digital phase shift circuit iB is adopted as a second digital phase shift circuit $B_2$, . . . , and an (n−1) (h) digital phase shift circuit $B_{n-1}$.

The fourth modified digital phase shift circuit dB has the same configuration as the configuration adopted in the fifth embodiment. The ninth modified digital phase shift circuit iB has a configuration in which between the first loop ground conductor 11a and the second loop ground conductor 11b in the eighth modified digital phase shift circuit hB, the first loop ground conductor 11a is deleted.

According to the digital phase shifter A10, the inductance value during the high-delay mode can also be increased similarly to the digital phase shifter A9 according to the ninth embodiment. Also, since the first ground conductor 4a and the first loop ground conductor 11a are deleted, it is possible to achieve size reduction as compared with the digital phase shifter A9 and to increase a difference (a phase shift amount) between the phase during the low-delay mode and the phase during the high-delay mode.

Therefore, according to the tenth embodiment, it is possible to further increase a difference (a phase shift amount) between the phase during the high-delay mode and the phase during the low-delay mode as compared with the digital phase shifter A1 of the first embodiment. Also, according to the tenth embodiment, the size of the digital phase shifter A10 can be reduced.

Also, in the digital phase shifter A10 according to the tenth embodiment, the second outer line 3b may be deleted instead of the first outer line 3a between the two outer lines 3a and 3b included in each basic digital phase shift circuit B. In other words, in the digital phase shifter A10 according to the tenth embodiment, each fourth modified digital phase shift circuit dB may be replaced with the fifth modified digital phase shift circuit eB described in the fifth embodiment. Also, the second loop ground conductor 11b may be deleted instead of the first loop ground conductor 11a between the two loop ground conductors 11a and 11b included in each eighth modified digital phase shift circuit hB.

DESCRIPTION OF REFERENCE NUMERALS

A1 to A10 Digital phase shifter
B, $B_1$ to $B_n$ Basic digital phase shift circuit
aB, $aB_1$ to $aB_{n-1}$ First modified digital phase shift circuit
bB, $bB_1$ to $bB_{n-1}$ Second modified digital phase shift circuit
cB, $cB_2$ to $cB_{n-1}$ Third modified digital phase shift circuit
dB, $dB_2$ to $dB_{n-1}$ Fourth modified digital phase shift circuit
eB, $eB_2$ to $eB_{n-1}$ Fifth modified digital phase shift circuit
fB, $fB_2$ to $fB_{n-1}$ Sixth modified digital phase shift circuit
gB, $gB_2$ to $gB_{n-1}$ Seventh modified digital phase shift circuit
hB, $hB_2$ to $hB_{n-1}$ Eighth modified digital phase shift circuit (modified digital phase shift circuit)
iB, $iB_2$ to $iB_{n-1}$ Ninth modified digital phase shift circuit
1 Signal line
2a First inner line
2b Second inner line
3a First outer line
3b Second outer line
4a First ground conductor
4b Second ground conductor
5 Capacitor
6a First connection conductor
6b Second connection conductor
6c Third connection conductor
6d Fourth connection conductor
6e Fifth connection conductor
6f Sixth connection conductor
6g Seventh connection conductor
7a First electronic switch
7b Second electronic switch
7c Third electronic switch
7d Fourth electronic switch (electronic switch for capacitor)
8 Switch controller
10 Connection unit
11a First loop ground conductor
11b Second loop ground conductor

The invention claimed is:

1. A digital phase shifter comprising:
a first row;
a second row arranged to extend in parallel to the first row and to overlap the first row viewed in an orthogonal direction to a direction in which the first row extends; and
a connection unit electrically connecting one end of the first row and one end of the second row, wherein each of the first row and the second row is configured by connecting a plurality of digital phase shift circuits in cascade, each of the digital phase shift circuits including at least a signal line, two inner lines provided on both sides of the signal line, an outer line provided outside of one of the two inner lines or provided outside of the other of the two inner lines, a first ground conductor connected to one end of each of the inner lines and the outer line, a second ground conductor connected to the other end of the outer line, and two electronic switches, each of the electronic switches being provided between the other end of each of the inner lines and the second ground conductor, wherein the first ground conductor and the second ground conductor adjacent to each other are separated for the digital phase shift circuits adjacent to each other in the first row, wherein positional relationships of the outer line to the signal line are reversed for the digital phase shift circuits adjacent to each other in the first row, wherein the first ground conductor and the second ground conductor adjacent to each other are separated for the digital phase shift circuits adjacent to each other in the second row, wherein positional relationships of the outer line to the signal line are reversed for the digital phase shift circuits adjacent to each other in the second row, and wherein a plurality of the outer lines included in the first row are not adjacent to a plurality of the outer lines included in the second row in the orthogonal direction.

2. The digital phase shifter according to claim 1, wherein the inner lines and the outer line are formed in the same conductive layer.

* * * * *